(12) United States Patent
Tobita

(10) Patent No.: US 6,861,889 B2
(45) Date of Patent: Mar. 1, 2005

(54) AMPLITUDE CONVERTING CIRCUIT

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/450,268

(22) PCT Filed: Feb. 26, 2002

(86) PCT No.: PCT/JP02/01760

§ 371 (c)(1),
(2), (4) Date: Jun. 12, 2003

(65) Prior Publication Data

US 2004/0041614 A1 Mar. 4, 2004

(51) Int. Cl.[7] .................................................. H03L 5/00
(52) U.S. Cl. ....................................... 327/333; 327/390
(58) Field of Search .......................... 327/55, 57, 333, 327/390, 108, 427, 589; 326/68, 80, 81, 83, 88

(56) References Cited

U.S. PATENT DOCUMENTS 6,255,888 B1 * 7/2001 Satomi ........................ 327/333
6,288,591 B1 * 9/2001 Riccio ......................... 327/333
6,359,593 B1 * 3/2002 Marino et al. ............... 327/333
2002/0180508 A1 * 12/2002 Kanno et al. ................ 327/333
2003/0169224 A1 * 9/2003 Tobita ........................... 345/98
2003/0169225 A1 * 9/2003 Tobita ......................... 345/100

FOREIGN PATENT DOCUMENTS

| JP | 49-73644 | 7/1974 |
| JP | 50-151433 | 12/1975 |
| JP | 11017520 | 1/1999 |
| JP | 11177409 | 7/1999 |
| JP | 2001085989 | 3/2001 |
| WO | WO 01/56158 A1 * | 8/2001 |

* cited by examiner

Primary Examiner—Long Nguyen
(74) Attorney, Agent, or Firm—Leydig, Voit & Mayer, Ltd.

(57) ABSTRACT

A level shifter includes first and second P type thin film transistors (TFTs) and first and second N type TFTs for latching levels of first and second output nodes, third and fourth N type TFTs for setting levels of the first and second output nodes, and first and second resistance elements and first and second capacitors for applying, between the gate-source of the third and fourth N type TFTs, a voltage higher than a voltage of an input signal, in response to rising and falling edges of the input signal respectively.

23 Claims, 17 Drawing Sheets

AMPLITUDE CONVERTING CIRCUIT

TECHNICAL FIELD

The present invention relates to an amplitude converting circuit and, more specifically, to an amplitude converting circuit for converting amplitude of a signal.

BACKGROUND ART

FIG. 17 is a block diagram representing a configuration of a portion related to image display of a conventional portable telephone.

Referring to FIG. 17, the portable telephone includes a control LSI 51, which is an MOST (MOS transistor) type integrated circuit, a level shifter 52, which is an MOST type integrated circuit, and a liquid crystal display device 53, which is a TFT (Thin Film Transistor) type integrated circuit.

Control LSI 51 generates a control signal for liquid crystal display device 53. The "H" level of this control signal is 3V, and the "L" level is 0V. Though a number of control signals are generated actually, only one control signal will be described here for simplicity. Level shifter 52 converts logic level of the control signal from control LSI 51 and generates an internal control signal. The "H" level of this internal control signal is 7.5V and the "L" level is 0V. Liquid crystal display device 53 displays images in accordance with the internal control signal from level shifter 52.

FIG. 18 is circuit diagram representing a configuration of level shifter 52. Referring to FIG. 18, level shifter 52 includes P channel MOS transistors 54, 55 and N channel MOS transistors 56, 57. P channel MOS transistors 54 and 55 are connected between a node N51 of a power supply potential VCC (7.5V) and output nodes N54 and N55, respectively, with their gates connected to output nodes N55 and N54, respectively. N channel MOS transistors 56 and 57 are connected between output nodes N54 and N55 and a node of the ground potential GND, with their gates receiving input signals VI and /VI, respectively.

Assume that the input signals VI and /VI are at the "L" level (0V) and "H" level (3V), respectively, and that the output signals VO and /VO are at the "H" level (7.5V) and the "L" level (0V). At this time, MOS transistors 54 and 57 are conductive, and MOS transistors 55 and 56 are non-conductive.

In this state, when the input signal VI rises from the "L" level (0V) to the "H" level (3V) and the input signal /VI falls from the "H" level (3V) to the "L" level (0V), first, N channel MOS transistor 56 is rendered conductive and the potential at node N54 lowers. When the potential at node N54 becomes lower than a potential that is the power supply potential VCC minus the absolute value of the threshold voltage of P channel MOS transistor 55, P channel MOS transistor 55 is gradually rendered conductive, and the potential at node N55 begins to increase. When the potential at node N55 begins to increase, the source-gate voltage of P channel MOS transistor 54 becomes smaller and the conduction resistance value of P channel MOS transistor 54 becomes higher, and the potential at output node N54 further lowers. Therefore, the circuit operates in a positive feedback manner, and the level converting operation ends when the output nodes VO and /VO attains to the "L" level (0V) and the "H" level (7.5V), respectively.

FIG. 19 is a circuit diagram representing a configuration of another conventional level shifter 60. Referring to FIG. 19, level shifter 60 differs from level shifter 52 shown in FIG. 18 in that P channel MOS transistors 61 and 62 are added. P channel MOS transistor 61 is inserted between the drain of P channel MOS transistor 54 and output node N54, and receives at its gate the input signal VI. P channel MOS transistor 62 is inserted between the drain of P channel MOS transistor 55 and output node N55, and receives at its gate the input signal /VI.

In level shifter 60, when the input signal VI rises from the "L" level (0V) to the "H" level (3V), P channel MOS transistor 61 is rendered from conductive to non-conductive, and the current flowing from node N51 of the power supply potential VCC to output node N54 is reduced, facilitating lowering of the potential at output node N54. As a result, P channel MOS transistor 55 is rendered conductive, facilitating increase of the potential at output node N55. Thus, operation margin becomes larger than level shifter 52 of FIG. 18.

As described above, in the conventional level shifters 52 and 60, it is a presupposition of operation that N channel MOS transistor 56 is rendered conductive in response to the rise of the input signal VI from the "L" level (0V) to the "H" level (3V). In order for N channel MOS transistor 56 to be rendered conductive, it is necessary that the threshold potential of N channel MOS transistor 56 is not higher than the "H" level (3V) of the input signal VI.

In a general semiconductor LSI, the threshold voltage of a transistor can easily be set to 3V or lower. A low-temperature polysilicon TFT that is included in the liquid crystal display device, however, has considerable fluctuation in threshold voltage, and therefore, it is difficult to set the threshold voltage of the TFT at 3V or lower. For this reason, a level shifter 52 or 60 formed by high-breakdown voltage MOS transistors is provided between control LSI 51 and liquid crystal display device 53 to convert logic level of signals.

Provision of such level shifter 52 or 60, however, means addition of cost of the level shifter 52 or 60 to the system cost, resulting in increased system cost.

DISCLOSURE OF THE INVENTION

Therefore, a main object of the present invention is to provide an amplitude converting circuit that operates properly even when amplitude voltage of an input signal is smaller than the threshold voltage of an input transistor.

The amplitude converting circuit in accordance with the present invention converts a first signal of which amplitude is a first voltage, to a second signal of which amplitude is a second voltage higher than the first voltage. The amplitude converting circuit includes first and second transistors of a first conductivity type, both receiving at their first electrodes the second voltage, having their second electrodes connected to first and second output nodes to output the second signal and a complementary signal thereof, respectively, and their input electrodes connected to the second and first output nodes, respectively, third and fourth transistors of a second conductivity type having their first electrodes connected to the first and second output nodes, respectively, and a driving circuit driven by the first signal and a complementary signal thereof, applying a third voltage higher than the first voltage between the input electrode and the second electrode of the third transistor in response to a leading edge of the first signal to render conductive the third transistor, and applying the third voltage between the input electrode and the second electrode of the fourth transistor in response to a trailing edge of the first signal to render conductive the fourth transistor. The third voltage, which is higher than the first voltage as the amplitude voltage of the fist signal, is applied between the input electrode and the second electrode of the third or fourth transistor, in response to a leading edge or a trailing edge of the first signal. Therefore, operation is ensured even when the amplitude voltage of the first signal is lower than the threshold voltage of the third or fourth transistor, Preferably, the driving circuit includes a first resistance element connected between the input electrode and the second electrode of the third transistor, a first capacitor having one electrode receiving the complementary signal of the first signal and the other electrode connected to the input electrode of the third transistor, a second resistance element connected between the input electrode and the second electrode of the fourth transistor, and a second capacitor having one electrode receiving the first signal and the other electrode connected to the input electrode of the fourth transistor, and applies the first signal and the complementary signal thereof to the second electrodes of the third and the fourth transistors, respectively. Here, the first voltage is further applied through the first or the second capacitor to the input electrode of the third or fourth transistor that has been charged to the first voltage through the first or the second resistance element.

Preferably, the first resistance element includes a fifth transistor connected between the input electrode and the second electrode of the third transistor and receiving at its input electrode a fourth voltage. The second resistance element includes a sixth transistor connected between the input electrode and the second electrode of the fourth transistor and receiving at its input electrode the fourth voltage. Here, only a small area is occupied by the first and second resistance elements.

Preferably, the fifth and sixth transistors are of the second conductivity type, and the fourth voltage is equal to the second voltage. Thus, only a small number of voltage sources are required.

Preferably, the first resistance element includes a fifth transistor connected between the input electrode and the second electrode of the third transistor. The second resistance element includes a sixth transistor connected between the input electrode and the second electrode of the fourth transistor. The driving circuit further includes a pulse generating circuit that raises the resistance value of the fifth transistor pulse-wise in response to a leading edge of the first signal and raises the resistance value of the sixth transistor pulse-wise in response to a trailing edge of the first signal. Thus, lowering of the potential of the third and fourth transistors can be made moderate.

Preferably, the fifth and sixth transistors are of the second conductivity type. The pulse generating circuit includes a third resistance element connected between a node of a fourth voltage of the same polarity as the second voltage and the input electrode of the fifth transistor, a third capacitor having one electrode receiving the first signal and the other electrode connected to the input electrode of the fifth transistor, a fourth resistance element connected between the node of the fourth voltage and the input electrode of the sixth transistor, and a fourth capacitor having one electrode receiving a complementary signal of the first signal and the other electrode connected to the input electrode of the sixth transistor. Here, the input electrode of the fifth or sixth transistor charged to the fourth voltage through the third or fourth resistance element is down-converted by the amount of the first voltage, through the third or fourth capacitor.

Preferably, the fourth voltage is equal to the second voltage. Thus, only a small number of voltage sources are required.

Preferably, the fifth and sixth transistors are of the first conductivity type. The pulse generating circuit includes a third resistance element connected between a node of a fourth voltage of an opposite polarity to the second voltage and the input electrode of the fifth transistor, a third capacitor having one electrode receiving a complementary signal of the first signal and the other electrode connected to the input electrode of the fifth transistor, a fourth resistance element connected between the node of the fourth voltage and the input electrode of the sixth transistor, and a fourth capacitor having one electrode receiving the first signal and the other electrode connected to the input electrode of the sixth transistor. Here, the input electrode of the fifth or sixth transistor charged to the fourth voltage through the third or fourth resistance element is boosted by the amount of the first voltage, through the third or fourth capacitor.

Preferably, the driving circuit further includes a first diode element connected between the second electrode and the input electrode of the third transistor, and a second diode element connected between the second electrode and the input electrode of the fourth transistor. Thus, it is possible to quickly charge the input electrode of the third or fourth transistor to the first voltage.

Preferably, the driving circuit includes a first resistance element connected between the second electrode of the third transistor and a node of a reference voltage, a first capacitor having one electrode receiving the first signal and the other electrode connected to the second electrode of the third transistor, a second resistance element connected between the second electrode of the fourth transistor and the node of the reference voltage, and a second capacitor having one electrode receiving a complementary signal of the first signal and the other electrode connected to the second electrode of the fourth transistor, and applies the first signal and the complementary signal thereof to the input electrodes of the fourth and third transistors, respectively. Here, the second electrode of the third or fourth transistor that is set to the reference voltage through the first or second resistance element is down-converted by the amount of the second voltage, through the first or second capacitor.

Preferably, the first resistance element includes a fifth transistor connected between the second electrode of the third transistor and a node of a reference voltage. The second resistance element includes a sixth transistor connected between the second electrode of the second transistor and the node of the reference voltage. The driving circuit further includes a pulse generating circuit that raises the resistance value of the fifth transistor pulse-wise in response to a leading edge of the first signal and raises the resistance value of the sixth transistor pulse-wise in response to a trailing edge of the first signal. Here, increase of the voltage at the input electrodes of the third and fourth transistors can be made moderate.

Preferably, the fifth and sixth transistors are of the second conductivity type. The pulse generating circuit includes a third resistance element connected between a node of a fourth voltage of the same polarity as the second voltage and the input electrode of the fifth transistor, a third capacitor having one electrode receiving the first signal and the other electrode connected to the input electrode of the fifth transistor, a fourth resistance element connected between the node of the fourth voltage and the input electrode of the sixth transistor, and a fourth capacitor having one electrode receiving a complementary signal of the first signal and the other electrode connected to the input electrode of the sixth transistor. Thus, the input electrode of the fifth or sixth transistor that is charged to the fourth voltage through the third or fourth resistance element is down-converted by the amount of the first voltage, through the third or fourth capacitor.

Preferably, the fourth voltage is equal to the second voltage. Thus, only a small number of voltage sources are required.

Preferably, a latch circuit is further provided for latching the potentials of the first and second output nodes. Thus, the potentials at the first and second output nodes can be held stably.

Preferably, the latch circuit includes fifth and sixth transistors of the second conductivity type, having their first electrodes connected to the first and second output nodes, respectively, receiving at their second electrodes the first signal and the complementary signal thereof, respectively, and having their input nodes connected to the second and first output nodes, respectively. Thus, the latch circuits can be formed in a simple manner.

Preferably, the latch circuit includes fifth and sixth transistors of the second conductivity type connected between the first and second output nodes and a node of a reference voltage, respectively, and having their input electrodes connected to the second and first output nodes, respectively. Thus, only a small drivability is required for the first signal and the complementary signal thereof.

Preferably, a fifth transistor of the first conductivity type inserted between the second electrode of the first transistor and the first output node and having its input electrode connected to the input electrode of the third transistor, and a sixth transistor of the first conductivity type inserted between the second electrode of the second transistor and the second output node and having its input electrode connected to the input electrode of the fourth transistor are further provided. Here, the current flowing from the node of the second voltage to the first and second output nodes can be reduced, and current consumption can be reduced.

Preferably, the first to fourth transistors are thin film transistors. The present invention is particularly effective in this case.

BEST MODES FOR CARRYING OUT THE INVENTION

First Embodiment

Figure 1:
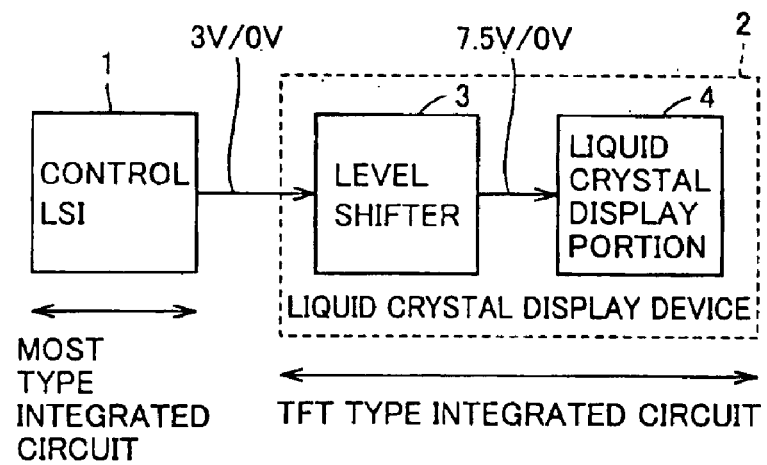
FIG. 1 is a block diagram representing a portion related to image display of a portable telephone in accordance with a first embodiment of the present invention.

FIG. 1 is a block diagram representing a configuration of a portion related to image display of a portable telephone in accordance with a first embodiment of the present invention.

Referring to FIG. 1, the portable telephone includes a control LSI 1, which is an MOST type integrated circuit, and a liquid crystal display device 2, which is a TFT type integrated circuit, and liquid crystal display device 2 includes a level shifter 3 and a liquid crystal display portion 4.

Control LSI 1 outputs a control signal for liquid crystal display device 2. The "H" level of the control signal is 3V, and the "L" level is 0V. Though a number of control signals are generated actually, only one control signal will be described here for simplicity. Level shifter 3 converts logic level of the control signal from control LSI 1 and generates an internal control signal. The "H" level of this internal control signal is 7.5V and the "L" level is 0V. Liquid crystal display portion 4 displays images in accordance with the internal control signal from level shifter 3.

Figure 2:
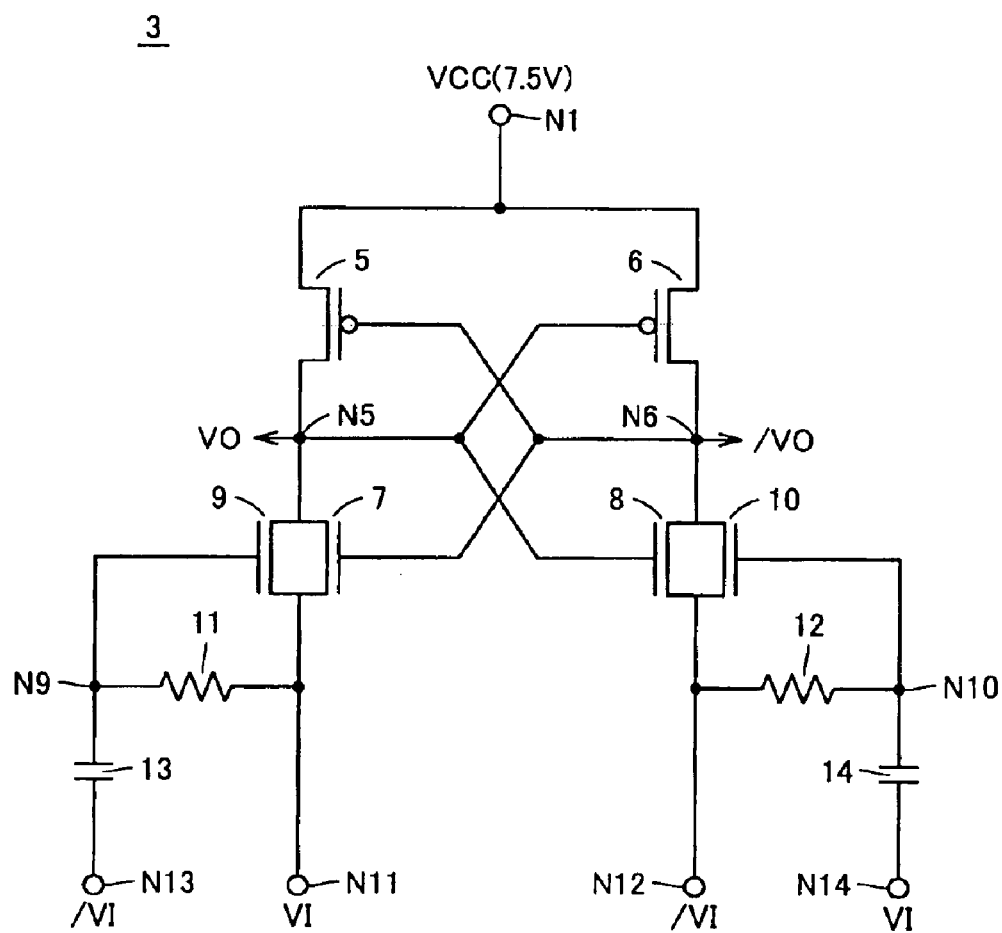
FIG. 2 is a circuit diagram of the level shifter shown in FIG. 1.

FIG. 2 is a circuit diagram representing a configuration of level shifter 3. Referring to FIG. 2, level shifter 3 includes P type TFTs 5,6, N type TFTs 7 to 10, resistance elements 11, 12 and capacitors 13, 14. P type TFTs 5 and 6 are connected between a node N1 of the power supply potential VCC (7.5V) and output nodes N5 and N6, respectively, with their gates connected to output nodes N6 and N5, respectively. Signals appealing at output nodes N5 and N6 are the output signals VO and /VO of level shifter 3, respectively. N type TFT 7 is connected between output node N5 and an input node N11, with its gate connected to output node N6. N type TFT 8 is connected between output node N6 and an input node N12, with its gate connected to output node N5. Input nodes N11 and N12 receive input signals VI and /VI, respectively. P type TFTs 5 and 6 and N type TFTs 7 and 8 constitute latch circuits for latching the levels at output nodes N5 and N6.

N type TFT 9 is connected between input node N11 and output node N5, with its gate connected to a node N9. N type TFT 10 is connected between input node N11 and output node N6, with its gate connected to node N10. Resistance element 11 is connected between nodes N9 and N11, while resistance element 12 is connected between nodes N10 and N12. Capacitor 13 is connected between an input node N13 and node N9, and capacitor 14 is connected between an input node N14 and node N10. Input nodes N13 and N14 receive input signal /VI and VI, respectively. Resistance element 11 and capacitor 13 form a boosting circuit, and resistance element 12 and capacitor 14 form a boosting circuit.

Figure 3:
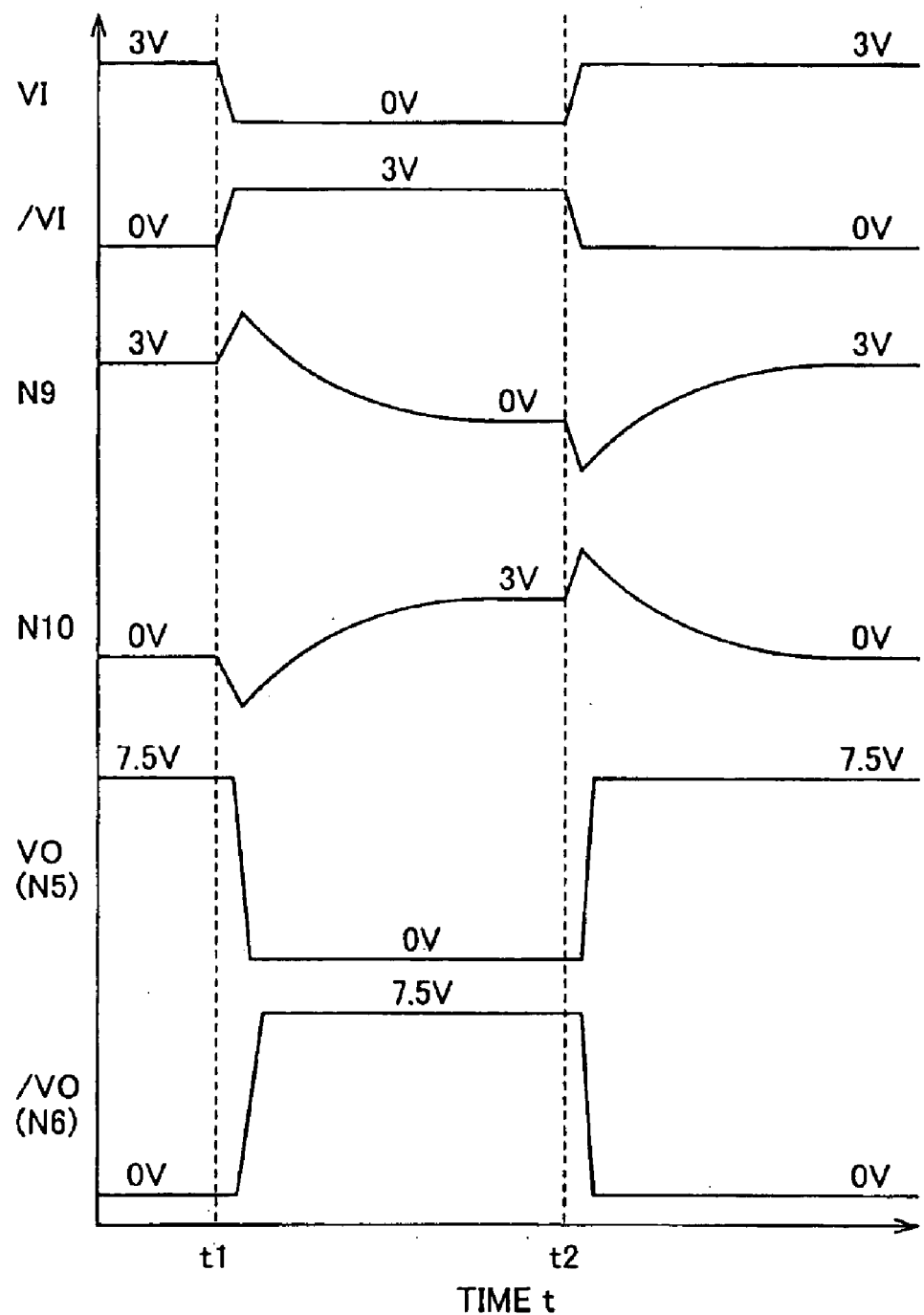
FIG. 3 is a time chart representing an operation of the level shifter shown in FIG. 2.

FIG. 3 is a time chart representing an operation of level shifter 3 shown in FIG. 2. Referring to FIG. 3, in the initial state, the input signals VI and /VI are set to the "H" level (3V) and "L" level (0V), respectively, and the output signals VO and /VO are set to the "H" level (7.5V) and the "L" level (0V), respectively. At this time, node N9 is set to the same potential as the input signal VI, that is, 3V, by resistance element 11, and node N10 is set to the same potential as the input signal /VI, that is, 0V, by resistance element 12. Because of these potential relations, P type TFT 5 and N type TFT 8 are rendered conductive, and other TFTs 6, 7, 9 and 10 are non-conductive. Specifically, output node N5 receives the power supply potential VCC (7.5V) through P type TFT 5, and output node N6 receives the potential (0V) of the input signal /VI through N type TFT 8.

When the input signal VI falls from the "H" level (3V) to the "L" level (0V) and the input signal /VI rises from the "L" level (0V) to the "H" level (3V) at time point t1, potential change of input signal /VI is transmitted through capacitor 13 to node N9, and the potential of node N9 increases to a potential of 3V or higher. The amount of potential increase at this time is in most part determined by the ratio between the capacitance value of capacitor 13 and the capacitance value of a parasitic capacitance (not shown) of node N9. When the capacitance value of capacitor 13 is set to be sufficiently larger than the capacitance value of the parasitic capacitance of node N9, node N9 increases nearly to 6V, double the amplitude voltage (3V) of the input signals VI and /VI.

As the input signal VI falls from the "H" level (3V) to the "L" level (0V) simultaneously with the input signal /VI, charges at node N9 are discharged through resistance element 11 to node N11. Therefore, the potential of node N9 increases from 3V to the peak and then lowers gradually to 0V. Here, by appropriately setting the resistance value of resistance element 11, it becomes possible to maintain the potential of node N9 at a prescribed potential not lower than 3V only for a prescribed time period. When the potential of node 9 attains to the prescribed potential, N type TFT 9 is rendered conductive, and the potential of output node N5 lowers. When the potential of output node N5 lowers, P type TFT 6 is rendered conductive and the potential of output node N6 increases. Thus, P type TFT 5 is rendered non-conductive, N type TFT 7 is rendered conductive, and the potential of output node N5 rapidly lowers to the "L" level (0V).

Meanwhile, the potential change of the input signal VI from the "H" level (3V) to the "L" level (0V) is transmitted through capacitor 14 to node N10, and the potential of node N10 lowers from 0V to approximately −3V. There is no influence on the circuit operation, however, as the N type TFT 10 has already been rendered non-conductive.

As a result, the output signal VO falls from the "H" level (7.5V) to the "L" level (0V) and the output signal /VO rises from the "L" level (0V) to the "H" level (7.5V), and thus, a logic level conversion from 3V to 7.5V is accomplished.

The potentials of nodes N9 and N10 are respectively shifted by resistance elements 11 and 12 to the levels of the input signals VI and /VI as time passes. At time t2, potentials of nodes N9 and N10 are at the levels of the input signals VI and /VI, respectively. At time t2, when the input signal /VI rises from the "L" level (0V) to the "H" level (3V) and the input signal VI falls from the "H" level (3V) to the "L" level (0V), the circuit operates in a potential relation reverse to that described above.

In the first embodiment, a voltage (about 6V) higher than the amplitude voltage (3V) of the input signal VI is generated in response to a falling edge of the input signal VI and applied to gate-source of N type TFT 9. Therefore, even when the amplitude voltage (3V) of the input signal VI is lower than the threshold voltage of N type TFT 9, level shifter 3 operates. Accordingly, it becomes possible to implement level shifter 3 and liquid crystal display portion 4 in one liquid crystal display device 2 (TFT type integrated circuit). As compared with the conventional example in which level shifter 52 and liquid crystal display device 53 must be provided separately, the number of components can be reduced, and the system cost becomes lower.

Though a power supply current flows transiently during the operation, TFTs 5, 8 and 10 or TFTs 6, 7 and 9 are rendered non-conductive after the levels of output nodes N5 and N6 are established, and therefore, DC current does not flow from node N1 of the power supply potential VCC to input nodes N11 to N14. Therefore, power consumption of the circuit is quite small.

Though TFTs 5 to 10 are used in the first embodiment, MOS transistors may be used in place of the TFTs. In that case, operation is ensured even when the amplitude of the input signals VI and /VI is smaller than the threshold voltage of the MOS transistors.

Though TFTs, which are insulated gate type field effect transistors, are used in the first embodiment, field effect transistors of different types may be used.

Figure 4:
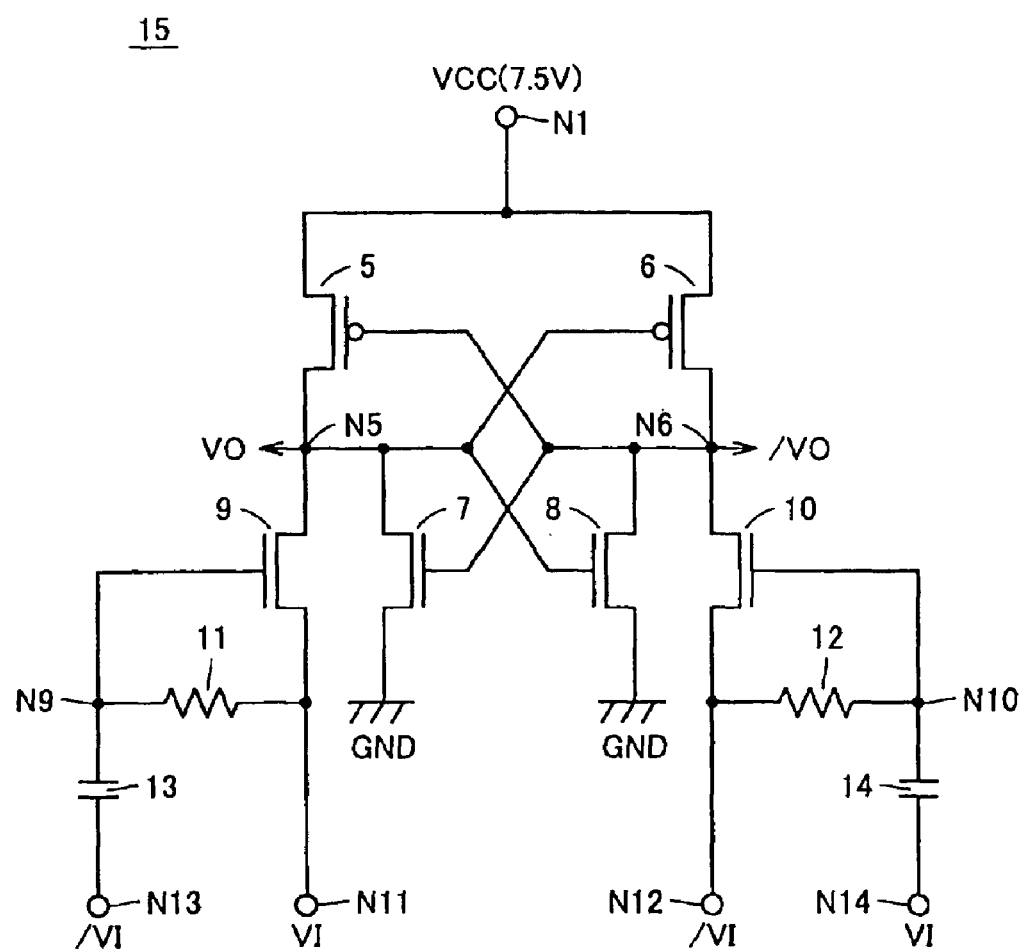
FIGS. 4 to 8 are circuit diagrams representing modifications of the first embodiment.

Various modifications of the first embodiment will be described in the following. In level shifter 15 shown in FIG. 4, N type TFTs 7 and 8 have their sources grounded. In this modification, currents of N type TFTs 7 and 8 are caused to flow not to the input nodes N 11 and N 12 but to the line of the ground potential GND, and therefore, only a small drivability is required for the input signals VI and /VI.

Figure 5:
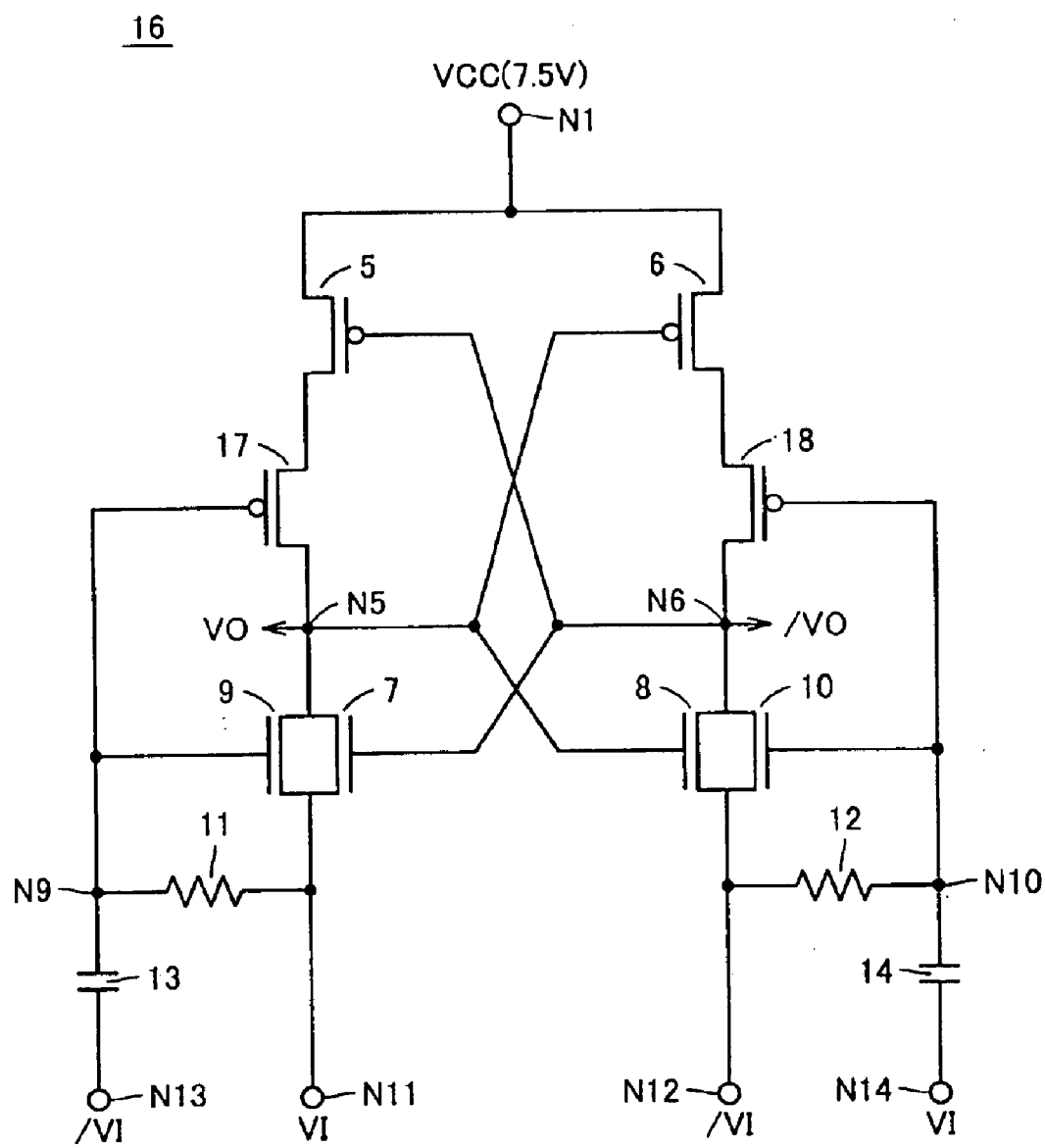

A level shifter 16 shown in FIG. 5 differs from level shifter 3 shown in FIG. 2 in that P type TFTs 17 and 18 are added. P type TFT 17 is inserted between the drain of P type TFT 5 and node N5, with its gate connected to node N9. P type TFT 18 is inserted between the drain of P type TFT 6 and node N6, with its gate connected to node N10. In this modification, when the input signal /VI rises from the "L" level (0V) to the "H" level (3V) (see time t1 of FIG. 3), P type TFT 17 changes from the conductive state to the non-conductive state, and suppresses the current flowing from node N1 of the power supply potential VCC to output node N5, facilitating lowering of the potential at node N5. As a result, P type transistor N6 is rendered conductive quickly, facilitating increase of the potential at node N6. Further, P type TFTs 17 and 18 are rendered non-conductive and the current flowing from node N1 of the power supply potential to output nodes N5 and N6 is suppressed as described above, and the power consumption can be reduced.

Figure 6:
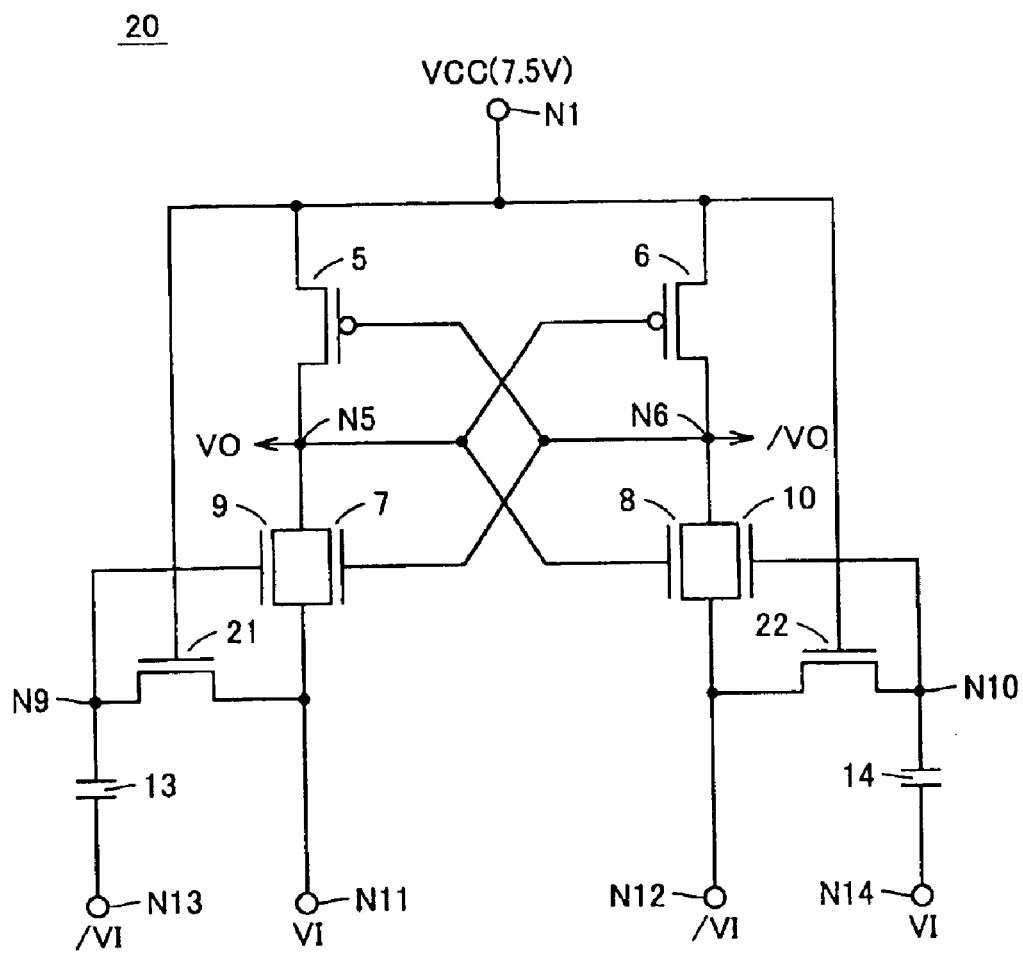

A level shifter 20 shown in FIG. 6 differs from level shifter 3 shown in FIG. 2 in that resistance elements 11 and 12 are replaced by N type TFTs 21 and 22, respectively. N type TFT 21 is connected between nodes N9 and N11, and receives at its gate the power supply potential VCC. N type TFT 22 is connected between nodes N10 and N12, and receives at its gate the power supply potential VCC. Each of N type TFTs 21 and 22 operates equivalently as a resistance element. Resistance value per unit dimension is higher than resistance elements 11 and 12 shown in FIG. 2, and therefore, area occupied by the resistance elements can be reduced. Each of N type TFTs 21 and 22 may be replaced by a P type TFT. In that case, however, it is necessary to apply a negative voltage (−7.5V) to the gate of the P type TFT.

Figure 7:
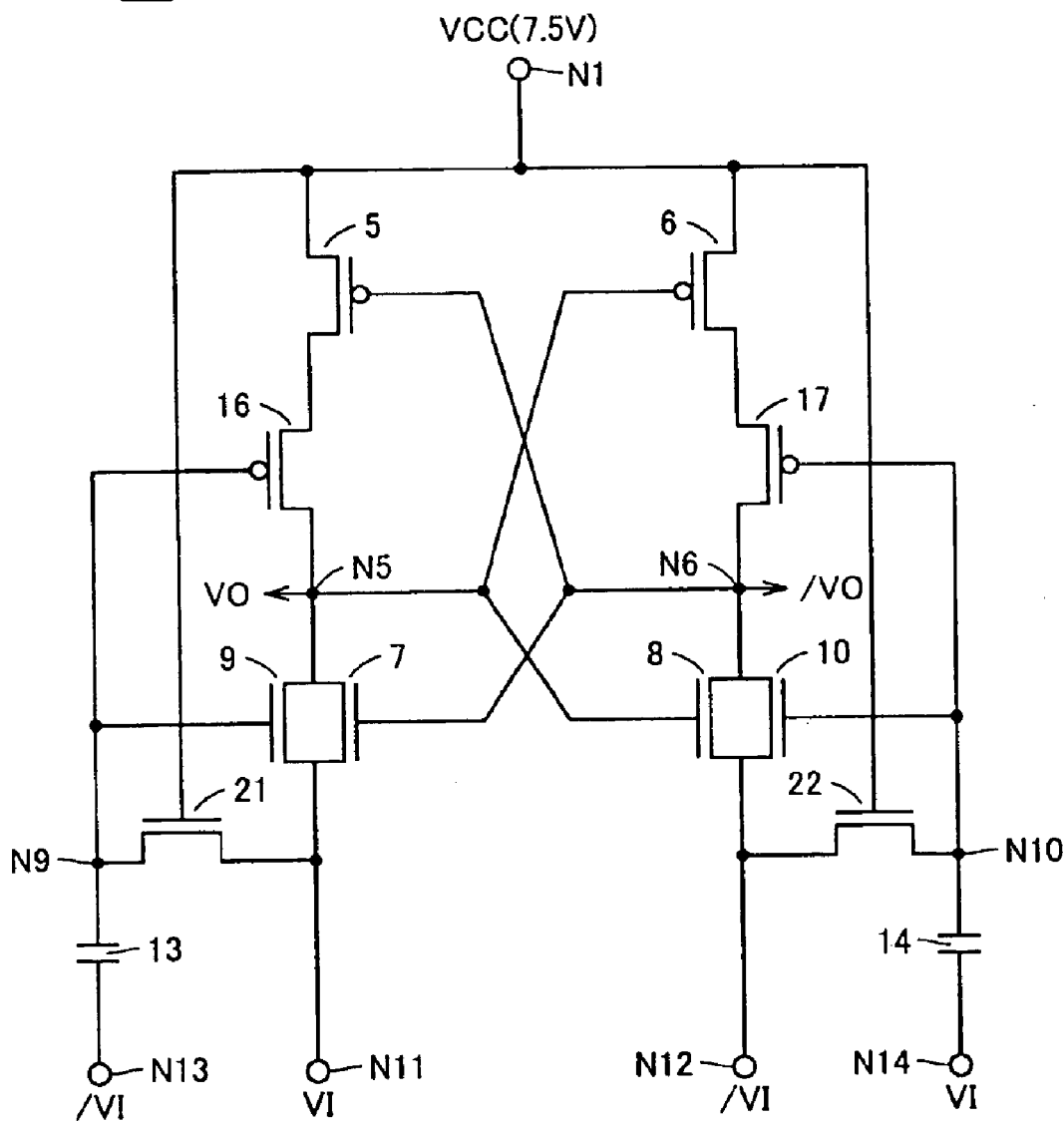

A level shifter 23 shown in FIG. 7 differs from level shifter 16 shown in FIG. 5 in that resistance elements 11 and 12 are replace by N type TFTs 21 and 22, respectively. Therefore, the present modification attains both effects of the modification shown in FIG. 5 and the modification shown in FIG. 6.

Figure 8:
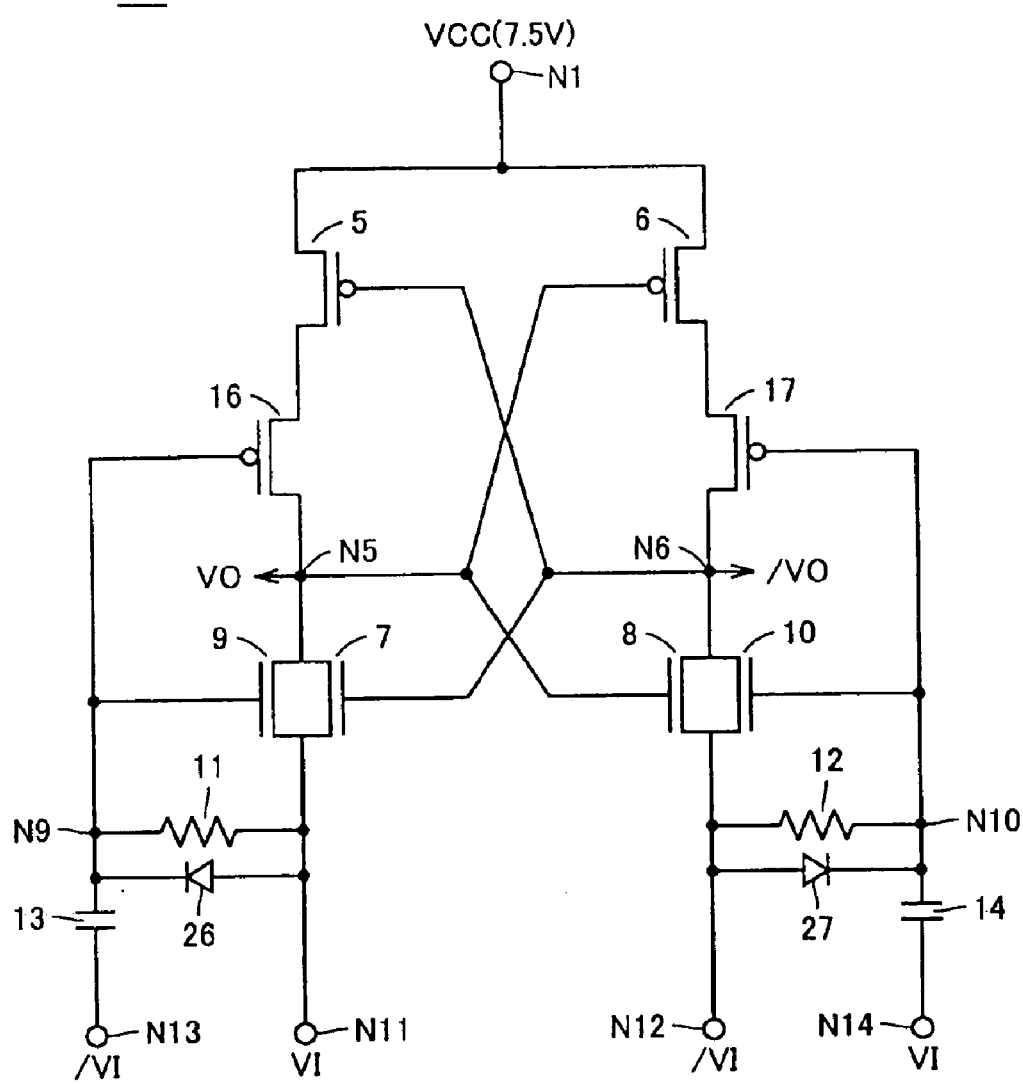

A level shifter 25 shown in FIG. 8 is provided by adding, to level shifter 16 shown in FIG. 5, diode elements 26 and 27. Diode element 26 is connected between nodes N11 and N9, and diode element 27 is connected between nodes N12 and N14. When the input signal VI rises from the "L" level (0V) to the "H" level (3V), diode element 26 accelerates increase of the node N9 to the "H" level (3V) (see FIG. 3). Accordingly, when the signal /VI rises from the "L" level (0V) to the "H" level (3V) next time, rise of node N9 to the "H" level (3V) becomes faster, and N type TFT 9 is rendered conductive quickly. Diode element 27 functions in the similar manner with respect to N type TFT 10. Therefore, in this modification, level change in the output signals VO and /VO with respect to the level change in input signals VI and /VI becomes faster.

Second Embodiment

Figure 9:
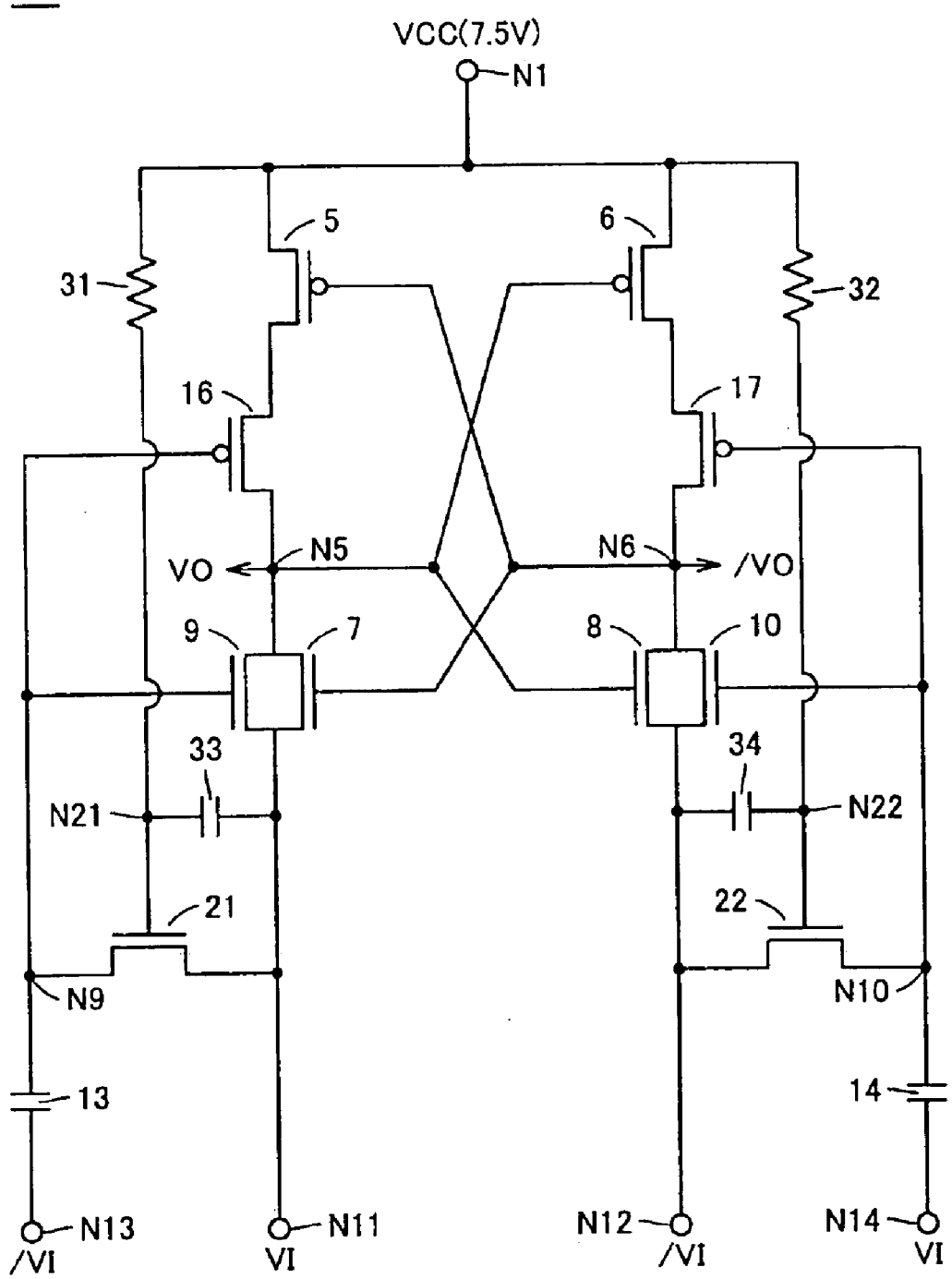
FIG. 9 is a circuit diagram representing a configuration of a level shifter in accordance with a second embodiment of the present invention.

FIG. 9 is a circuit diagram representing a configuration of a level shifter 30 in accordance with a second embodiment of the present invention, comparable to FIG. 7. Referring to FIG. 9, level shifter 30 differs from level shifter 23 shown in FIG. 7 in that resistance elements 31, 32 and capacitors 33, 34 are added. Resistance element 31 is inserted between node N1 of the power supply potential VCC and the gate of N type TFT 21 (node N21), and resistance element 32 is inserted between node N1 and the gate of N type TFT 22 (node N22). Capacitor 33 is connected between nodes N11 and N21, and capacitor 34 is connected between nodes N 12 and N22.

Figure 10:
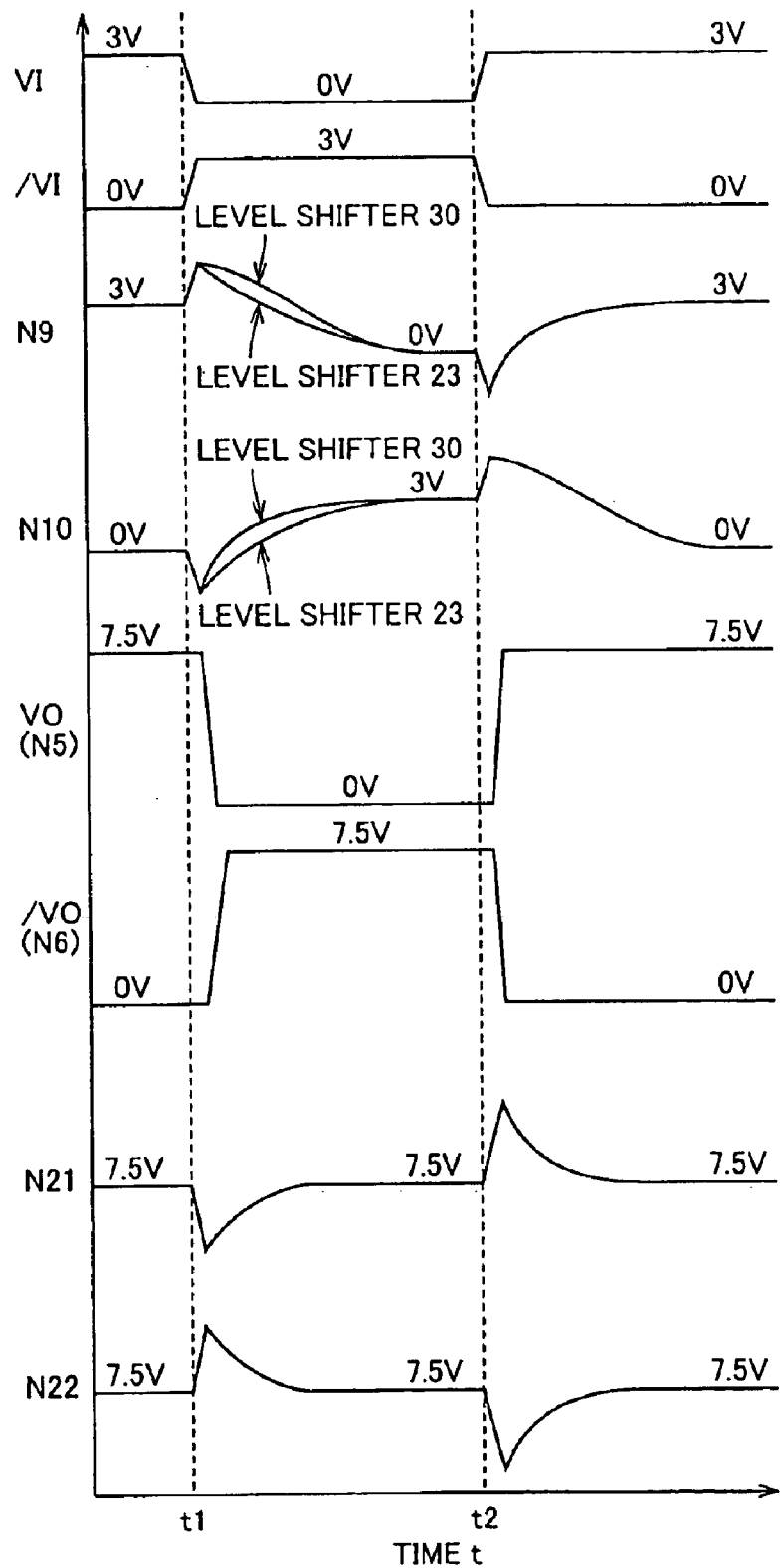
FIG. 10 is a time chart representing an operation of the level shifter shown in FIG. 9.

FIG. 10 is a time chart representing an operation of level shifter 30. Referring to FIG. 10, in the initial state, input signals VI and VI are set to the "H" level (3V) and the "L" level (0V), respectively, and the output signals VO and /VO are set to the "H" level (7.5V) and the "L" level (0V), respectively. Nodes N21 and N22 are receiving the power supply potential VCC (7.5V) through resistance elements 31 and 32, respectively, and hence N type TFTs 21 and 22 are conductive. Accordingly, node N9 is at the same potential as the input signal VI, that is, 3V, and node N10 is at the same potential as the input signal/VI, that is, 0V. Because of these potential relations, P type TFTs 5, 16 and N type TFT 8 are rendered conductive, and other TFTs 6, 7, 9, 10 and 17 are non-conductive. Specifically, output node N5 receives the power supply potential VCC (7.5V) through P type TFTs 5 and 16, and output node N6 receives the potential of the input signal /VI (0V) through N type TFT 8.

When the input signal VI falls from the "H" level (3V) to the "L" level (0V) and the input signal /VI rises from the "L" level (0V) to the "H" level (3V) at time point t1, potential change of input signal /VI is transmitted through capacitor 13 to node N9, and the potential of node N9 increases to a potential of 3V or higher. At the same time, the potential change of the input signal VI is transmitted through capacitor 33 to node N29, and the potential of node N21 lowers by about 3V. When the potential of node N21 lowers, a current flows from node N1 through resistance element 31 to node N21, and node N21 returns to the power supply potential VCC (7.5V). While node N21 is at a level lower than 7.5V, N type TFT 21 has a high resistance value.

Further, when the input signal VI falls from the "H" level (3V) to the "L" level (0V) at time t1, charges at node N9 are discharged through N type TFT 21 to node N11. Therefore, the potential at node N9 increases from 3V to the peak and then gradually lowers to 0V.

At this time, the resistance value of N type TFT 21 is kept relatively high only for a prescribed time period, and lowering of the level of node N1 becomes moderate as compared with level shifter 23 shown in FIG. 7. Thus, conduction time of N type TFT 9 becomes longer, facilitating lowering of the potential at node N5.

On the side of node N10, when the input signal VI falls from the "H" level (3V) to the "L" level (0V) and the input signal /VI rises from the "L" level (0V) to the "H" level (3V) at time t1, potential change in input signal /VI is transmitted through capacitor 14 to node N10, and the potential of node N10 lowers to 0V or lower. At the same time, potential change in the input signal /VI is transmitted through capacitor 34 to node N22, and the potential of node N22 increases by about 3V. When the potential of node N22 increases, a current flows from node N22 through resistance element 32 to node N21, and node N22 returns to the power supply potential VCC (7.5V). While the potential at node N22 is higher than 7.5V, N type TFT 22 has a low resistance value.

When the input signal /VI rises from the "L" level (0V) to the "H" level (3V), a current flows from node N12 through N type TFT 22 to node N10. Therefore, the potential of node N10 lowers from 0V to the peak, and thereafter gradually increases to 3V.

Here, the resistance value of N type TFT 22 is kept relatively low only for a prescribed time period, and hence increase of the level of node N10 becomes faster than in level shifter 23 shown in FIG. 7. Thus, boosting of node N10 at the next time point t2 is facilitated.

From the foregoing, it follows that the operation margin of level shifter 30 is larger than that of level shifter 23.

Though resistance elements 31 and 32 have one electrode connected to node N1 of the power supply potential VCC (7.5V), the one electrode may be connected to a node of a positive power supply potential different from the power supply potential VCC.

Further, each of resistance elements 31 and 32 may be formed by an N type TFT or a P type TFT. A positive potential higher than the power supply potential VCC may preferably be applied to the gate of the N type TFT, and a potential lower than the power supply potential VCC may preferably be applied to the gate of the P type TFT. P type TFTs 16 and 17 may be omitted.

Third Embodiment

Figure 11:
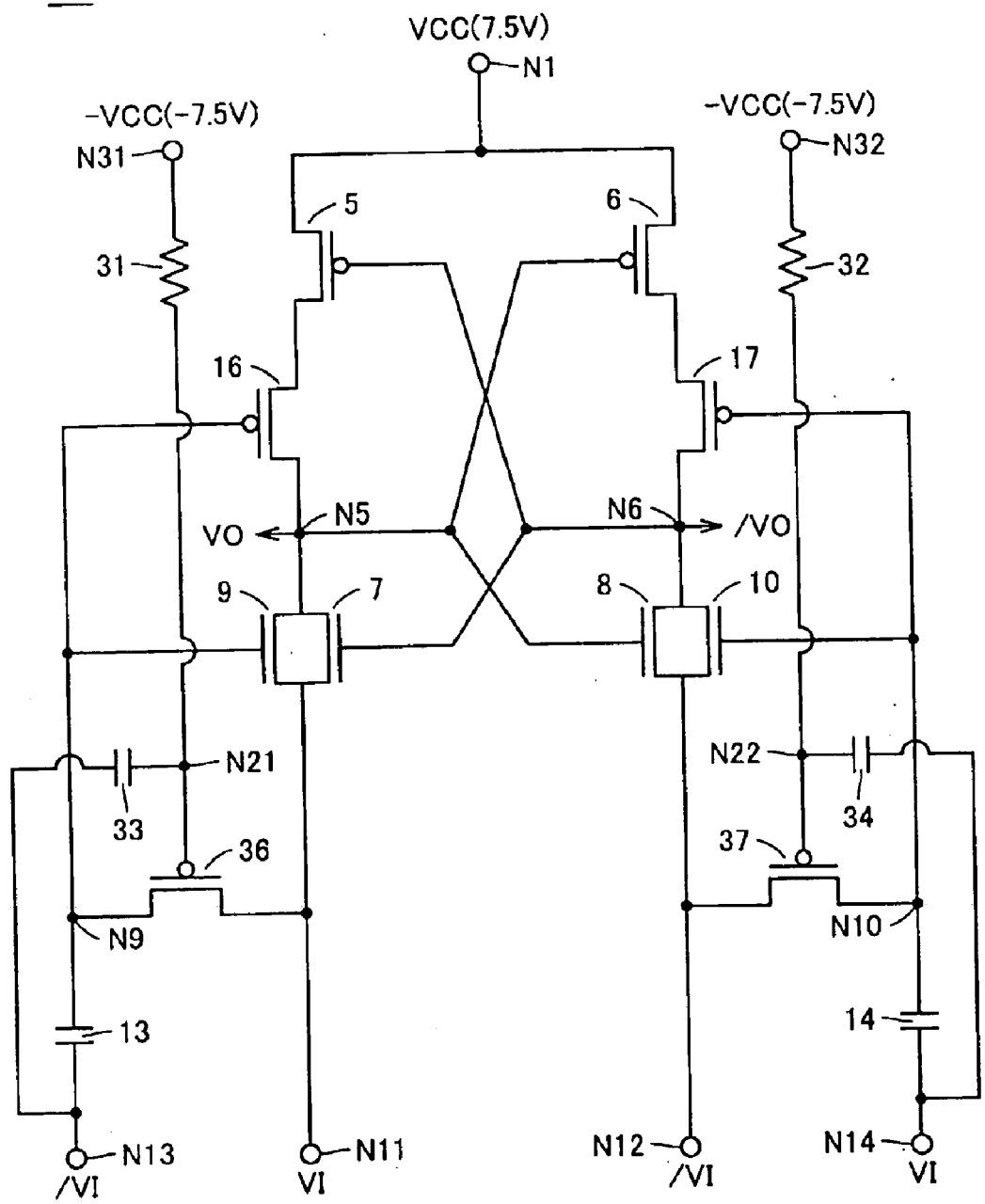
FIG. 11 is a circuit diagram representing a configuration of a level shifter in accordance with a third embodiment of the present invention.

FIG. 11 is a circuit diagram representing a configuration of a level shifter 35 in accordance with a third embodiment of the present invention, comparable to FIG. 9. Referring to FIG. 11, level shifter 35 differs from level shifter 30 shown in FIG. 9 in that N type TFTs 21 and 22 are replaced by P type TFTs 36 and 37. P type TFT 36 is connected between nodes N9 and N11, with its gate connected to node N21. P type TFT 37 is connected between nodes N10 and N12, with its gate connected to node N22.

Further, resistance element 31 is connected between node N21 and a node N31 of a negative power supply potential −VCC (−7.5V). Resistance element 32 is connected between node N22 and a node N32 of the negative power supply potential −VCC (−7.5V). Capacitor 33 is connected between nodes N13 and N21, and capacitor 34 is connected between nodes N14 and N22.

Figure 12:
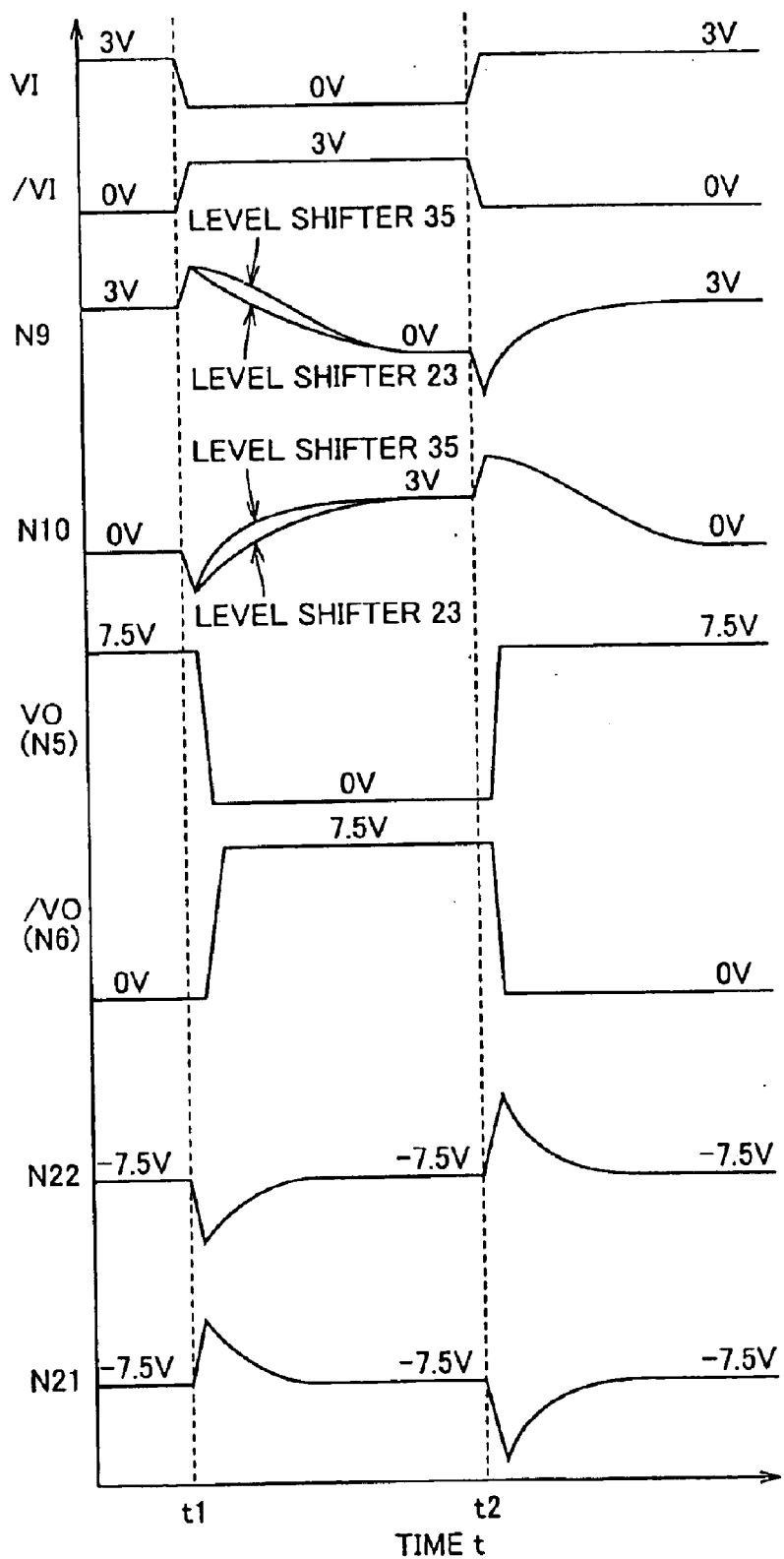
FIG. 12 is a time chart representing an operation of the time shifter shown in FIG. 11.

FIG. 12 is a time chart representing an operation of level shifter 35. Referring to FIG. 12, in the initial state, the input signals VI and /VI are set to the "H" level (3V) and the "L" level (0V), respectively, and the output signals VO and /VO are set to the "H" level (7.5V) and the "L" level (0V), respectively. Nodes N21 and N22 are receiving the negative power supply potential −VCC (−7.5V) through resistance elements 31 and 32, respectively, and hence P type TFTs 36 and 37 are conductive. Therefore, node N9 is set to the same potential as the input signal VI, that is, 3V, and node N10 is set to the same potential as the input signal /VI, that is, 0V. Because of these potential relations, P type TFTs 5, 16 and N type TFT 8 are rendered conductive, and other TFTs 6, 7, 9, 10 and 17 are non-conductive. Specifically, output node N5 receives the power supply potential VCC (7.5V) through P type TFTs 5 and 16, and output node N6 receives the potential of the input signal /VI (0V) through N type TFT 8.

When the input signal VI falls from the "H" level (3V) to the "L" level (0V) and the input signal /VI rises from the "L" level (0V) to the "H" level (3V) at time t1, potential change in the input signal /VI is transmitted through capacitor 13 to node N9, and the potential at node N9 increases to 3V or higher. At the same time, potential change in the input signal /VI is transmitted through capacitor 33 to node N21, and the potential of node N21 increases by about 3V. When the potential of node N21 increases, a current flows from node N21 through resistance element 31 to node N31, and node N21 returns to the negative power supply potential −VCC (−7.5V). While the potential at node N21 is higher than −7.5V, the resistance value of P type TFT 36 is high.

Further, when the input signal VI falls from the "H" level (3V) to the "L" level (0V) at time t1, charges at node N9 are discharged through P type TFT 36 to node N11. Therefore, the potential at node N9 increases from 3V to the peak, and thereafter lowers gradually to 0V.

At this time, the resistance value of P type TFT 36 is kept relatively high only for a prescribed time period, and hence lowering of the level of node N9 becomes moderate as compared with level shifter 23 shown in FIG. 7. Accordingly, conduction time of N type TFT 9 becomes longer, facilitating lowering of the potential at node N5.

On the side of node N10, at time, t1, when the input signal VI falls from the "H" level (3V) to the "L" level (0V) and the input signal /VI rises from the "L" level (0V) to the "H" level (3V), potential change in the input signal VI is transmitted through capacitor 14 to node N10, and the potential of node N10 lowers to 0V or lower. At the same time, potential change in the input signal VI is transmitted through capacitor 34 to node N22, and the potential of node N22 lowers by about 3V. When the potential at node N22 lowers, a current flows from node N32 through resistance element 32 to node N22, and node N22 returns to the negative power supply potential −VCC (−7.5V). While the potential at node N22 is lower than −7.5V, the resistance value of P type TFT 37 is low.

When the input signal /VI rises from the "L" level (0V) to the "H" level (3V) at time t1, a current flows from node N12 through P type TFT 37 to node N10. Therefore, the potential at node N10 lowers from 0V to the peak, and thereafter gradually increases to 3V.

At this time, as the resistance value of P type TFT 37 is kept relatively low only for a prescribed time period, level of node N10 increases faster than in level shifter 23 shown in FIG. 7. Accordingly, boosting of node N10 at the next time point t2 is facilitated.

From the foregoing, it follows that the operation margin of level shifter 35 is larger than that of level shifter 23.

Each of resistance elements 31 and 32 may be formed by an N type TFT or a P type TFT. A positive potential higher than the positive power supply potential VCC may preferably be applied to the gate of the N type TFT, and a potential lower than the negative power supply potential −VCC may preferably be applied to the gate of the P type TFT. P type TFTs 16 and 17 may be omitted.

Fourth Embodiment

Figure 13:
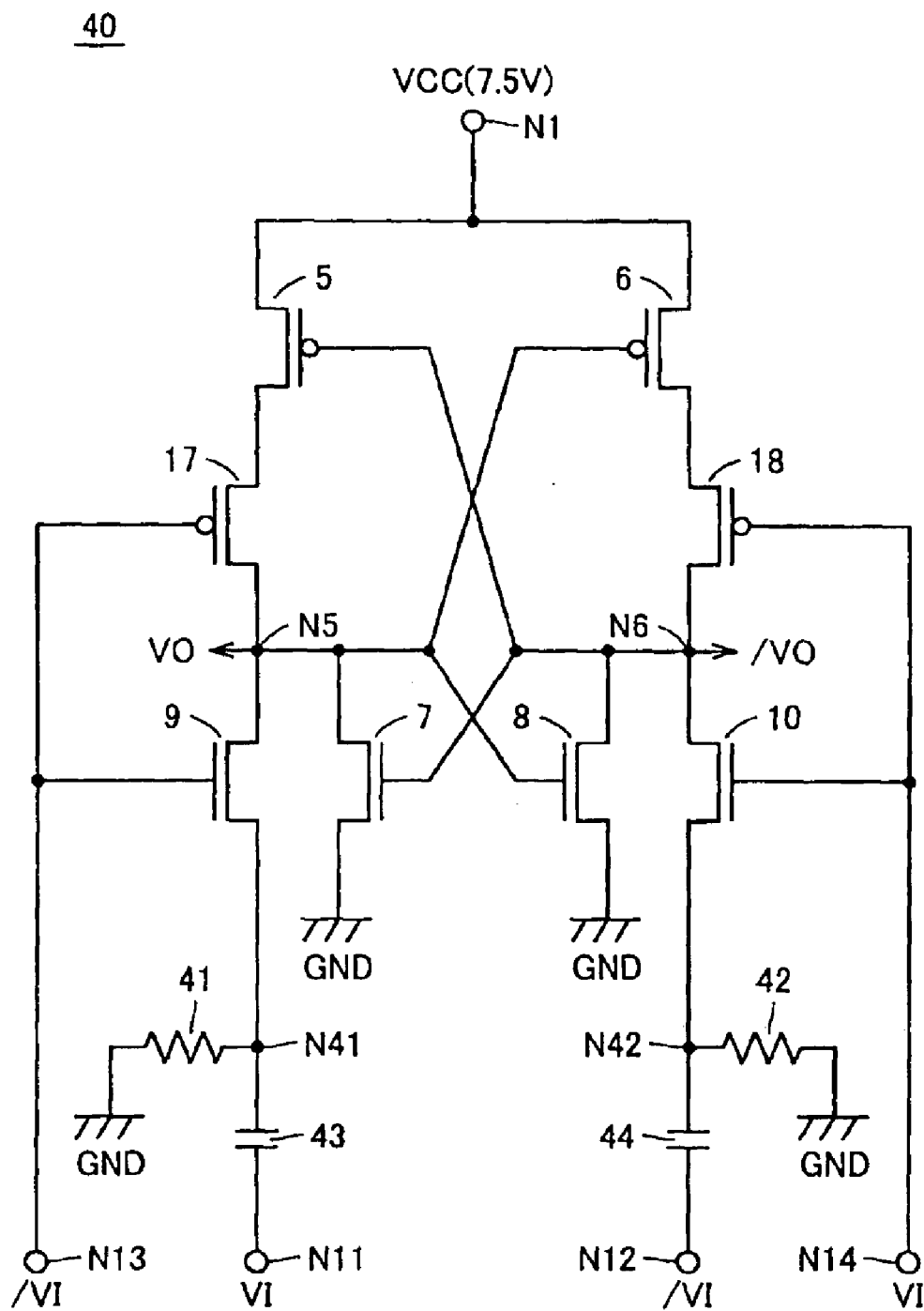
FIG. 13 is a circuit diagram representing a configuration of a level shifter in accordance with a fourth embodiment of the present invention.

FIG. 13 is a circuit diagram representing a configuration of level shifter 40 in accordance with a fourth embodiment of the present invention, comparable to FIG. 5.

Referring to FIG. 13, level shifter 40 differs from level shifter 16 shown in FIG. 5 in that N type TFTs 7 and 8 have their gates both grounded, and that resistance elements 11, 12 and capacitors 13, 14 are replaced by resistance elements 41, 42 and capacitors 43, 44, respectively.

Capacitor 43 is connected between input node N11 and the source (node N41) of N type TFT 9, and capacitor 44 is connected between input node N12 and the source (node N42) of N type TFT 10. Resistance elements 41 and 42 are connected between respective nodes N41, N42 and the line of the ground potential GND. The input signal /VI is applied directly to the gates of TFTs 9 and 17, and the input signal VI is directly applied to the gates of TFTs 10 and 18.

Figure 14:
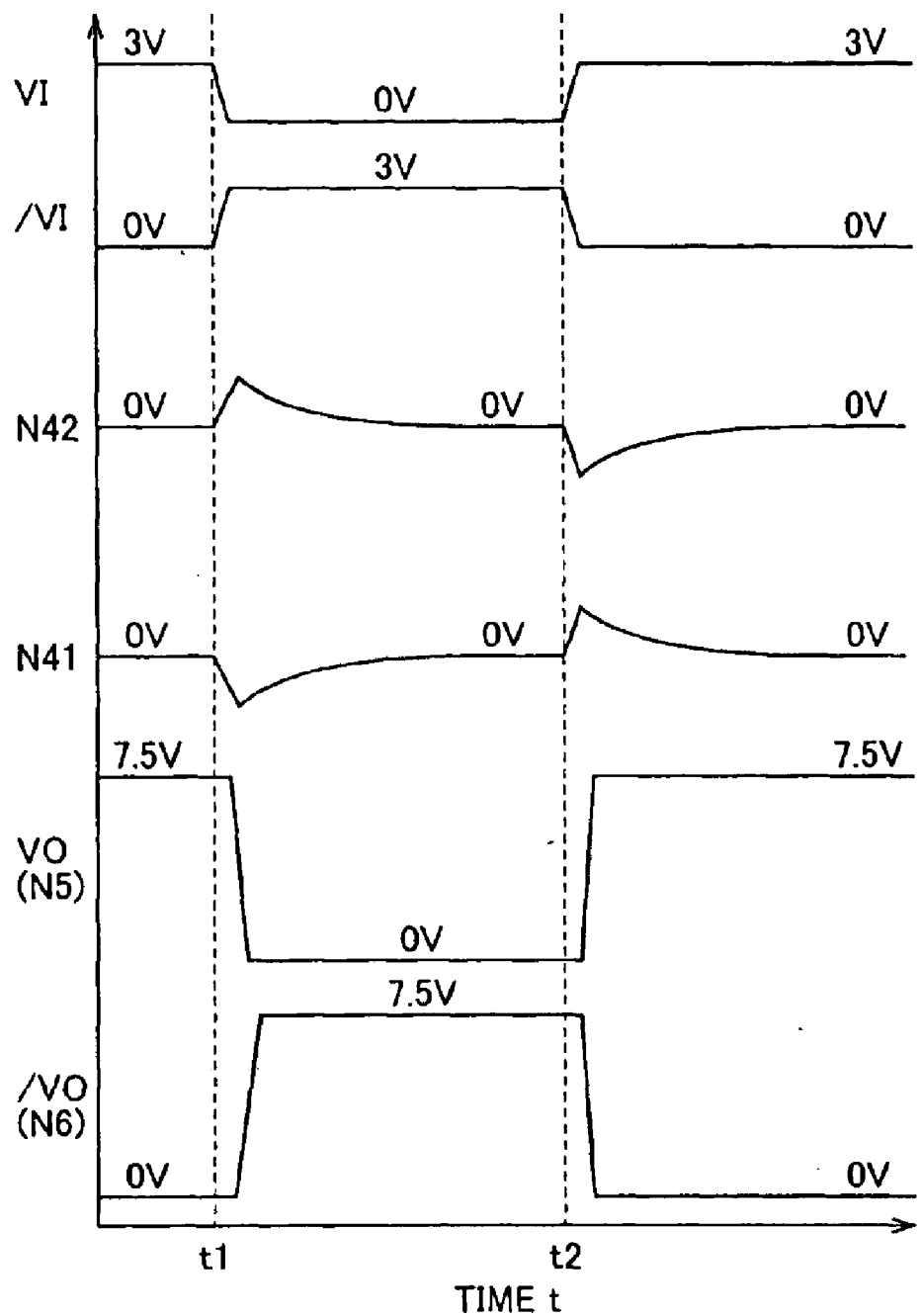
FIG. 14 is a time chart representing an operation of the level shifter shown in FIG. 13.

FIG. 14 is a time chart representing an operation of level shifter 40. Referring to FIG. 14, in the initial state, the input signals VI and /VI are set to the "H" level (3V) and the "L" level (0V), respectively, and the output signals VO and /VO are set to the "H" level (7.5V) and the "L" level (0V), respectively. Nodes N41 and N42 are set to the ground potential GND by resistance elements 41 and 42. Because of these potential relations, P type TFTs 5, 17 and N type TFTs 8, 10 are rendered conductive, and other TFTs 6, 7, 9 and 18 are rendered non-conductive. Specifically, output node N5 receives the power supply potential VCC (7.5V) through P type TFTs 5 and 7, and output node N6 receives the ground potential GND (0V) through N type TFT 8.

When the input signal VI falls from the "H" level (3V) to the "L" level (0V) and the input signal /VI rises from the "L" level (0V) to the "H" level (3V) at time t1, potential change in the input signal VI is transmitted through capacitor 43 to node N41, and node N41 lowers to the ground potential GND (0V) or lower. The amount of lowering of the potential is determined by the ratio between the capacitance value of capacitor 43 and the capacitance value of the parasitic capacitance (not shown) of node N41. When the capacitance value of capacitor 43 is set sufficiently larger than the capacitance value of the parasitic capacitance of node N41, the potential of node N41 lowers by the amplitude voltage of the input signal VI, to −3V.

When the potential of node N41 lowers to about −3V, a current flows from the line of the ground potential GND through resistance element 41 to node N 41. Therefore, the potential of node N41 lowers from 0V to the peak, and thereafter gradually increases to 0V. Here, by appropriately setting the resistance value of resistance element 41, it becomes possible to maintain the potential of node N41 at a prescribed potential not higher than 0V.

When node N41 attains to the prescribed potential, the gate-source voltage of N type TFT 9 attains to 3V to 6V, so that N type TFT 9 is rendered conductive and the potential at node N5 lowers. When the potential at node N5 lowers, P type TFT 6 is rendered conductive and the potential at node N6 increases. In this manner, as P type TFT 5 is rendered non-conductive, N type TFT 7 is rendered conductive, and the potential at node N5 lowers rapidly to the "L" level (0V).

Meanwhile, potential change in the input signal /VI from the "L" level (0V) to the "H" level (3V) is transmitted through capacitor 44 to node N42, and the potential at node N42 increases from 0V to approximately 3V. There is no influence to the circuit operation, however, as N type TFT 10 has already been rendered non-conductive.

As a result, the output signal VO falls from the "H" level (7.5V) to the "L" level (0V) and the output signal /VO rises from the "L" level (0V) to the "H" level (7.5V), and thus, a logic level conversion from 3V to 7.5V is accomplished.

Potentials of nodes N 41 and N42 are gradually made closer to the ground potential GND by resistance elements 41 and 42, respectively, as time passes, and at time t2, potentials at nodes N41 and N42 are approximately at the ground potential GND. At time t2, when the input signal VI rises from the "L" level (0V) to the "H" level (3V) and the input signal /VI falls from the "H" level (3V) to the "L" level (0V), the circuit operates in a potential relation reverse to that described above.

By the fourth embodiment, effects similar to that of the first embodiment can be obtained.

Figure 15:
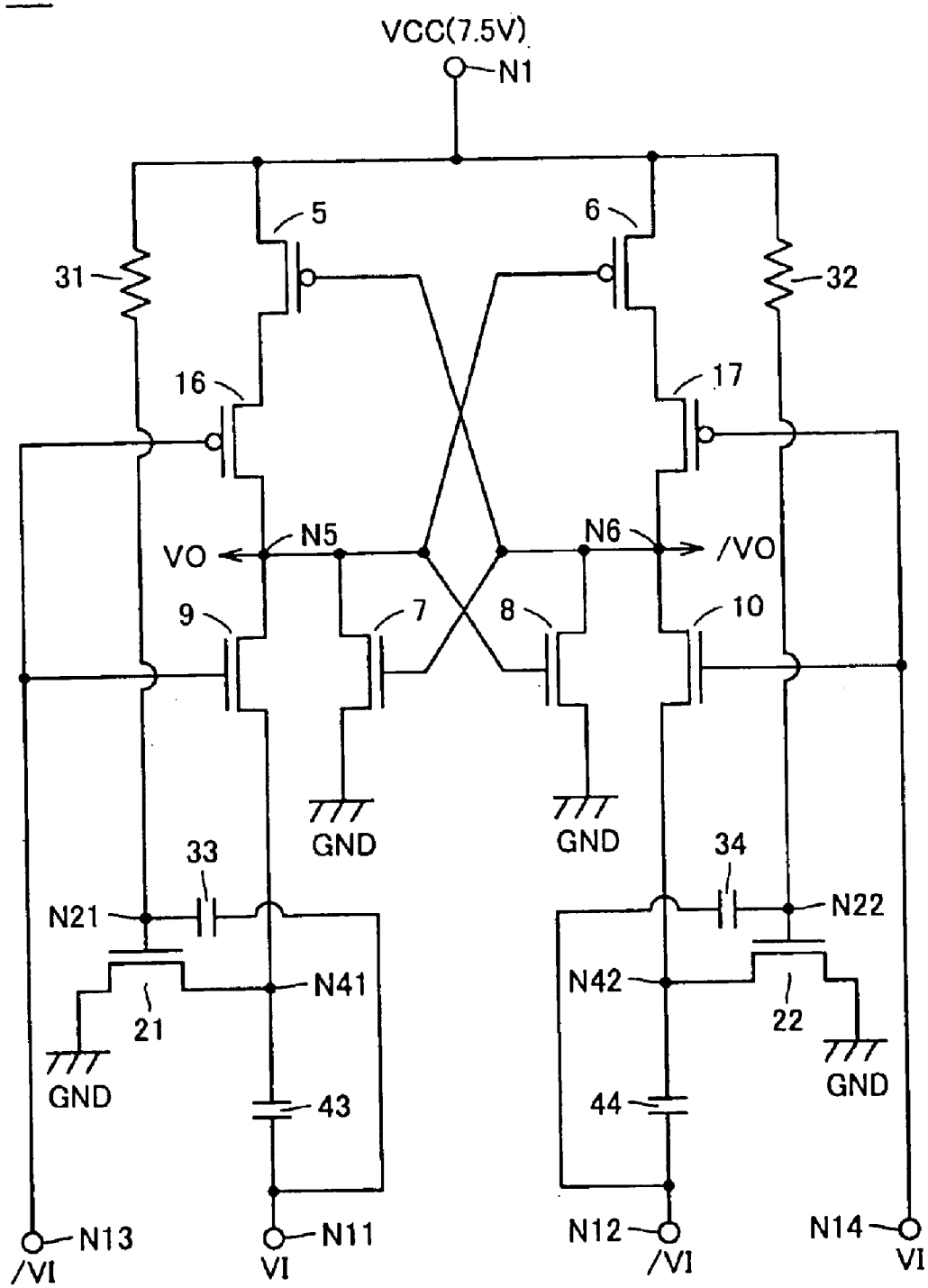
FIG. 15 is a circuit diagram representing a modification of the fourth embodiment.
Figure 16:
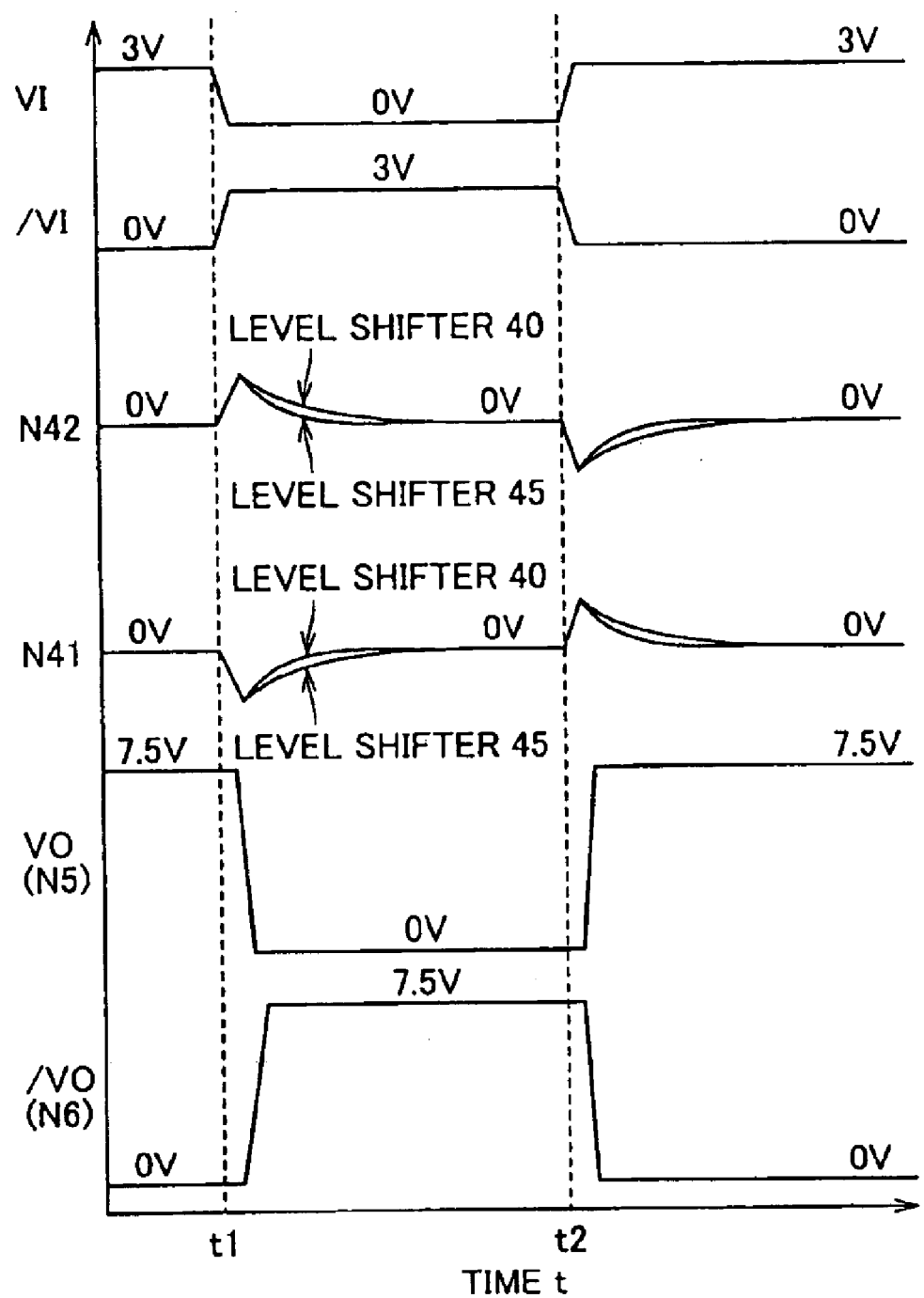
FIG. 16 is a time chart representing an operation of the level shifter shown in FIG. 15.
Figure 17:
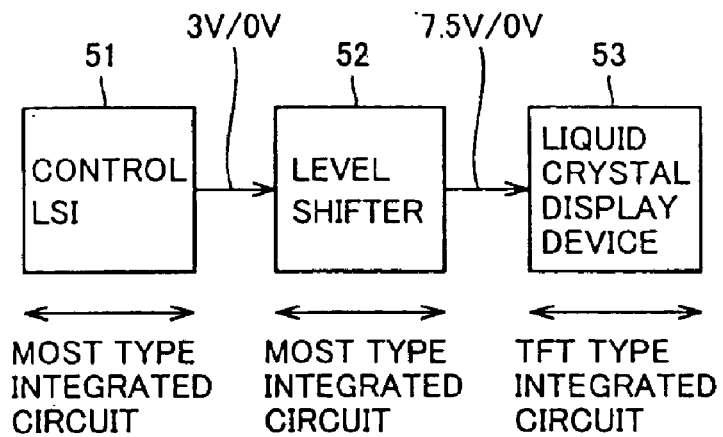
FIG. 17 is a block diagram representing a portion related to image display of a conventional portable telephone.
Figure 18:
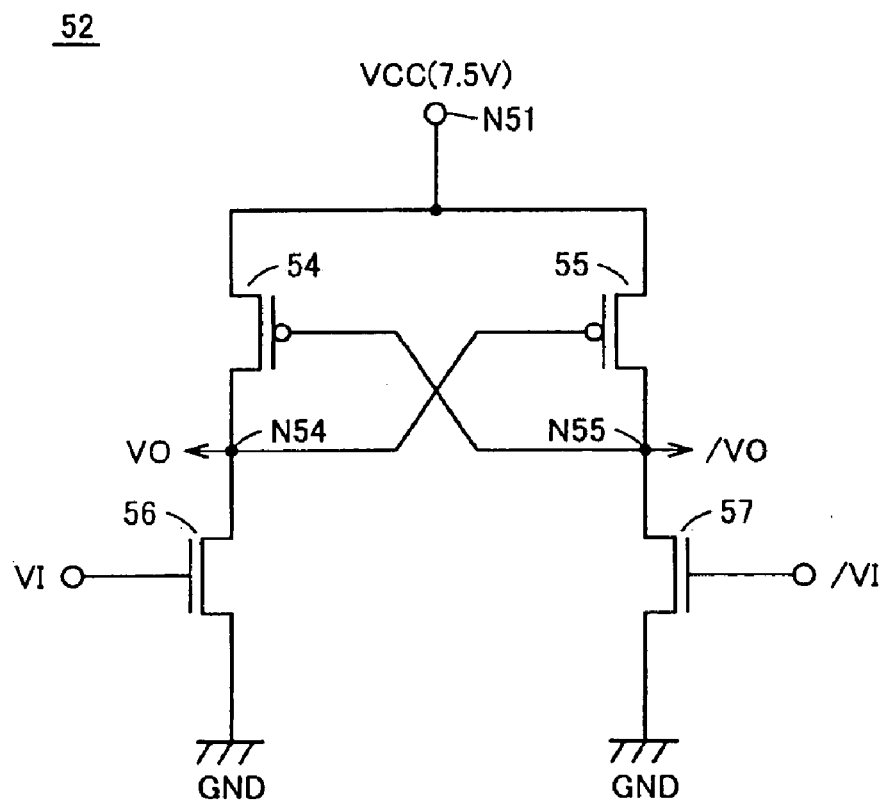
FIG. 18 is a circuit diagram representing a configuration of the level shifter shown in FIG. 17.
Figure 19:
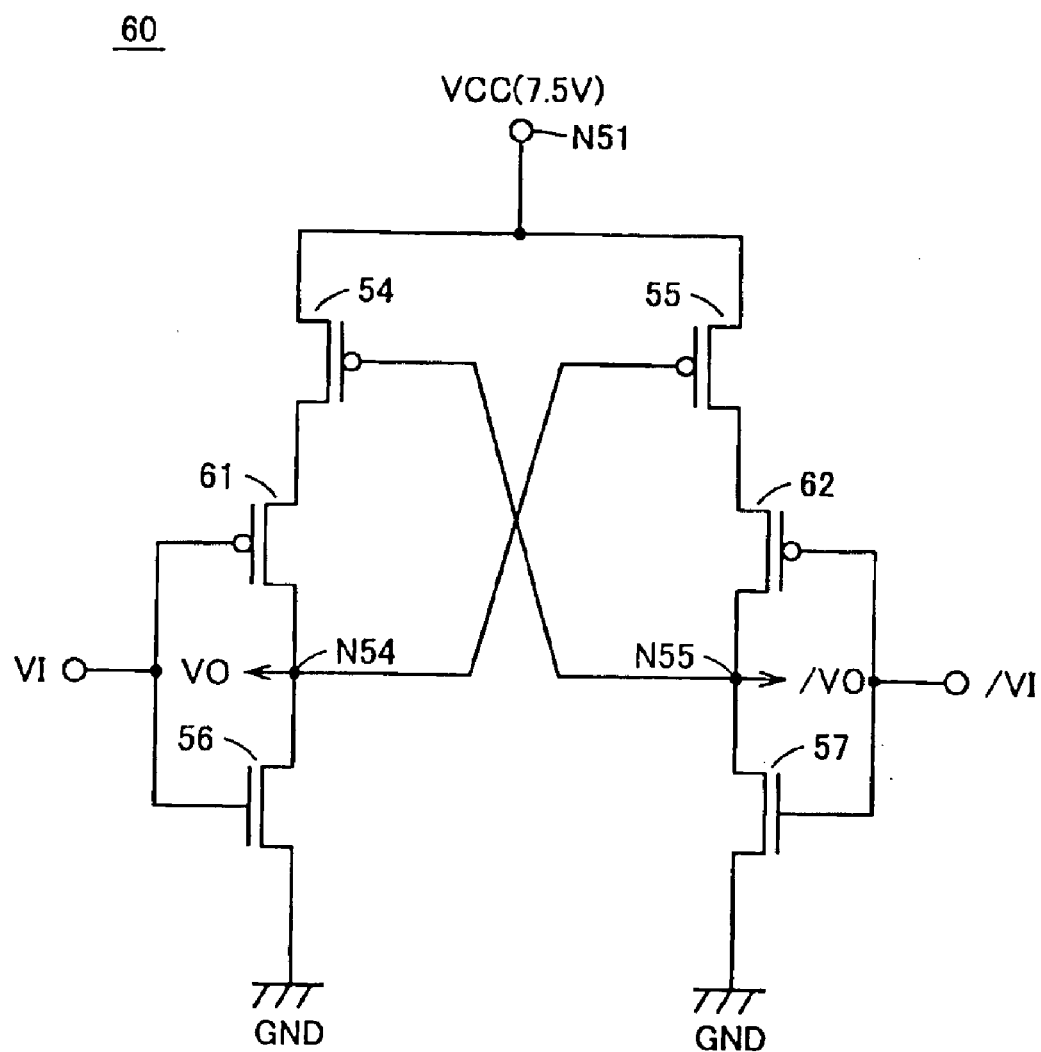
FIG. 19 is a circuit diagram representing another conventional level shifter.

Referring to FIG. 15, resistance elements 41 and 42 may be replaced by N type TFTs 21 and 22, resistance elements 31 and 32 may be connected between the gates of N type TFTs 21 and 22 (nodes N21, N22) and node N1, and capacitors 33 and 34 may be connected between nodes N11 and N12 and nodes N21 and N22, respectively, as in the second embodiment. Referring to FIG. 16, when the input signal VI falls from the "H" level (3V) to the "L" level (0V) at time t1, the potential at node N21 lowers by about 3V, and is maintained lower than the power supply potential VCC (7.5V) only for a prescribed time period. When the potential of node N21 becomes lower than 7.5V, the resistance value of N type TFT 21 becomes higher. Therefore, the level of node N41 increases moderately as compared with level shifter 40 shown in FIG. 13, facilitating lowering of output node N5 to the "L" level. Further, when the input signal /VI rises from the "L" level (0V) to the "H" level (3V) at time t1, the potential at node N22 increases by about 3V, and is maintained higher than the power supply potential VCC (7.5V) only for a prescribed time period. When the potential of node N21 becomes higher than 7.5V, the resistance value of N type TFT 22 becomes lower. Therefore, the level of node N42 lowers faster than in level shifter 40 shown in FIG. 13, facilitating the down-converting operation of node N42 at the next time point t2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplitude converting circuit converting a first signal, having a first voltage as an amplitude, to a second voltage, having a second voltage as an amplitude, the second voltage being higher than the first voltage, the circuit comprising:

first and second transistors of a first conductivity type, receiving at respective first electrodes the second voltage, and having second electrodes connected to first and second output nodes for outputting the second signal and a complement of the second signal, respectively, and input electrodes connected to the second and first output nodes, respectively;

third and fourth transistors of a second conductivity type having first electrodes connected to the first and second output nodes, respectively; and a driving circuit driven by the first signal and a complement of the first signal, applying a third voltage, higher than the first voltage, between an input electrode and a second electrode of said third transistor, in response to a leading edge of the first signal, to render said third transistor conductive, and applying the third voltage between an input electrode and a second electrode of said fourth transistor, in response to a trailing edge of the first signal, to render said fourth transistor conductive, said driving circuit including a first resistance element connected between the input electrode and the second electrode of said third transistor, a first capacitor having a first electrode receiving the complement of the first signal and a second electrode connected to the input electrode of said third transistor, a second resistance element connected between the input electrode and the second electrode of said fourth transistor, and a second capacitor having a first electrode receiving the first signal and a second electrode connected to the input electrode of said fourth transistor.

2. The amplitude converting circuit according to claim 1, wherein said first resistance element includes a fifth transistor connected between the input electrode and the second electrode of said third transistor and receiving at an input electrode a fourth voltage; and said second resistance element includes a sixth transistor connected between the input electrode and the second electrode of said fourth transistor and receiving at an input electrode the fourth voltage.

3. The amplitude converting circuit according to claim 2, wherein said fifth and sixth transistors are of the second conductivity type; and the fourth voltage is equal to the second voltage.

4. The amplitude converting circuit according to claim 1, wherein said first resistance element includes a fifth transistor connected between the input electrode and the second electrode of said third transistor;

said second resistance element includes a sixth transistor connected between the input electrode and the second electrode of said fourth transistor; and said driving circuit further includes a pulse generating circuit generating pulses temporarily increasing resistance of said fifth transistor in response to a leading edge of the first signal and temporarily increasing resistance of said sixth transistor in response to a trailing edge of the first signal.

5. The amplitude converting circuit according to claim 4, wherein said fifth and sixth transistors are of the second conductivity type; and said pulse generating circuit includes a third resistance element connected between a node at a fourth voltage, having the same polarity as the second voltage, and the input electrode of said fifth transistor, a third capacitor having a first electrode receiving the first signal and a second electrode connected to the input electrode of said fifth transistor, a fourth resistance element connected between the node at the fourth voltage and the input electrode of said sixth transistor, and a fourth capacitor having a first electrode receiving the complement of the first signal and a second electrode connected to the input electrode said sixth transistor.

6. The amplitude converting circuit according to claim 5, wherein the fourth voltage is equal to the second voltage.

7. The amplitude converting circuit according to claim 4, wherein said fifth and sixth transistors are of the first conductivity type; and said pulse generating circuit includes a third resistance element connected between a node at a fourth voltage, of polarity opposite to that of the second voltage, and the input electrode of said fifth transistor, a third capacitor having a first electrode receiving the complement of said first signal and a second electrode connected to the input electrode of said fifth transistor, a fourth resistance element connected between the node at the fourth voltage and the input electrode of said sixth transistor, and a fourth capacitor having a first electrode receiving the first signal and a second electrode connected to the input electrode of said sixth transistor.

8. The amplitude converting circuit according to claim 1, wherein said driving circuit further includes a first diode element connected between the second electrode and the input electrode of said third transistor, and a second diode element connected between the second electrode and the input electrode of said fourth transistor.

9. The amplitude converting circuit according to claim 1, further comprising a latch circuit for latching potentials of the first and second output nodes.

10. The amplitude converting circuit according to claim 9, wherein said latch circuit includes fifth and sixth transistors of the second conductivity type, having first electrodes connected to the first and second output nodes, respectively, second electrodes receiving the first signal and the complement of the first signal, respectively, and input electrodes connected to the second and first output nodes, respectively.

11. The amplitude converting circuit according to claim 9, wherein said latch circuit includes fifth and sixth transistors of the second conductivity type, connected between the first and second output nodes and a node at a reference potential, respectively, and having input electrodes connected to the second and first output nodes, respectively.

12. The amplitude converting circuit according to claim 9, wherein said first, second, third, and fourth transistors are thin film transistors.

13. The amplitude converting circuit according to claim 1, further comprising:

a fifth transistor of the first conductivity type inserted between the second electrode of said first transistor and the first output node and having an input electrode connected to the input electrode of said third transistor; and a sixth transistor of the first conductivity type inserted between the second electrode of said second transistor and the second output node and having an input electrode connected to the input electrode of said fourth transistor.

14. The amplitude converting circuit according to claim 1, wherein said first, second, third, and fourth transistors are thin film transistors.

15. An amplitude converting circuit converting a first signal, having a first voltage as an amplitude, to a second voltage, having a second voltage as an amplitude, the second voltage being higher than the first voltage, the circuit comprising:

first and second transistors of a first conductivity type, receiving at respective first electrodes the second voltage, and having second electrodes connected to first and second output nodes for outputting the second signal and a complement of the second signal, respectively, and input electrodes connected to the second and first output nodes, respectively;

third and fourth transistors of a second conductivity type having first electrodes connected to the first and second output nodes, respectively; and a driving circuit driven by the first signal and a complement of the first signal, applying a third voltage, higher than the first voltage, between an input electrode and a second electrode of said third transistor, in response to a leading edge of the first signal, to render said third transistor conductive, and applying the third voltage between an input electrode and a second electrode of said fourth transistor, in response to a trailing edge of the first signal, to render said fourth transistor conductive, said driving circuit including a first resistance element connected between the second electrode of said third transistor and a node at a reference voltage, a first capacitor having a first electrode receiving the first signal and a second electrode connected to the second electrode of said third transistor, a second resistance element connected between the second electrode of said fourth transistor and the node at the reference voltage, and a second capacitor having a first electrode receiving the complement of the first signal and a second electrode connected to the second electrode of said fourth transistor.

16. The amplitude converting circuit according to claim 15, wherein said first resistance element includes a fifth transistor connected between the second electrode of said third transistor and the node at the reference voltage;

said second resistance element includes a sixth transistor connected between the second electrode of said fourth transistor and the node at the reference voltage; and said driving circuit further includes a pulse generating circuit generating pulses temporarily increasing resistance of said fifth transistor in response to leading edge of the first signal and temporarily increasing resistance of said sixth transistor in response to a trailing edge of the first signal.

17. The amplitude converting circuit according to claim 16, wherein said fifth and sixth transistors are of the second conductivity type; and said pulse generating circuit includes a third resistance element connected between a node at a fourth voltage, having the same polarity as the second voltage, and the input electrode of said fifth transistor, a third capacitor having a first electrode receiving the first signal and a second electrode connected to the input electrode of said fifth transistor, a fourth resistance element connected between the node at the fourth voltage and the input electrode of said sixth transistor, and a fourth capacitor having a first electrode receiving the complement of the first signal and a second electrode connected to the input electrode of said sixth transistor.

18. The amplitude converting circuit according to claim 17, wherein the fourth voltage is equal to the second voltage.

19. The amplitude converting circuit according to claim 15, wherein said first, second, third, and fourth transistors are thin film transistors.

20. The amplitude converting circuit according to claim 15, further comprising a latch circuit for latching potentials of the first and second output nodes.

21. The amplitude converting circuit according to claim 20, wherein said latch circuit includes fifth and sixth transistors of the second conductivity type, having first electrodes connected to the first and second output nodes, respectively, second electrodes receiving the first signal and the complement of the first signal, respectively, and input electrodes connected to the second and first output nodes, respectively.

22. The amplitude converting circuit according to claim 20, wherein said latch circuit includes fifth and sixth transistors of the second conductivity type, connected between the first and second output nodes and a node at a reference potential, respectively, and having input electrodes connected to the second and first output nodes, respectively.

23. The amplitude converting circuit according to claim 15, further comprising:

a fifth transistor of the first conductivity type inserted between the second electrode of said first transistor and the first output node and having an input electrode connected to the input electrode of said third transistor; and a sixth transistor of the first conductivity type inserted between the second electrode of said second transistor and the second output node and having an input electrode connected to the input electrode of said fourth transistor.

* * * * *

UNITED STATES PATENT AND TRADEMARK OFFICE
CERTIFICATE OF CORRECTION

PATENT NO. : 6,861,889 B2
DATED : March 1, 2005
INVENTOR(S) : Youichi Tobita

It is certified that error appears in the above-identified patent and that said Letters Patent is hereby corrected as shown below:

Column 15,
Lines 58-60, cancel Claim 12.

Column 16,
Lines 6-8, cancel Claim 14.

Column 17,
Lines 13-15, cancel Claim 19.

Signed and Sealed this

Sixteenth Day of August, 2005

JON W. DUDAS
*Director of the United States Patent and Trademark Office*